(12) United States Patent
Lakkis

(10) Patent No.: US 8,352,846 B2
(45) Date of Patent: *Jan. 8, 2013

(54) METHOD AN APPARATUS FOR LOW DENSITY PARITY CHECK CODES ENCODING AND DECODING

(75) Inventor: Ismail Lakkis, San Diego, CA (US)

(73) Assignee: Adeptence, LLC, San Diego, CA (US)

( * ) Notice: Subject to any disclaimer, the term of this patent is extended or adjusted under 35 U.S.C. 154(b) by 916 days.

This patent is subject to a terminal disclaimer.

(21) Appl. No.: 12/437,545

(22) Filed: May 7, 2009

(65) Prior Publication Data

US 2010/0287438 A1  Nov. 11, 2010

(51) Int. Cl.
*G06F 11/00* (2006.01)
*H03M 13/00* (2006.01)
(52) U.S. Cl. .......... 714/801; 714/752; 714/758
(58) Field of Classification Search .......... 714/752, 714/758, 801
See application file for complete search history.

(56) References Cited

U.S. PATENT DOCUMENTS

| | | |
|---|---|---|
| 2006/0291571 A1 | 12/2006 | Divsalar |
| 2007/0157061 A1 | 7/2007 | Lee |
| 2007/0162815 A1 | 7/2007 | El-Khamy |
| 2008/0028272 A1 | 1/2008 | Richardson |
| 2008/0028274 A1 | 1/2008 | Lin |
| 2008/0072122 A1 | 3/2008 | Nimbalker |
| 2008/0155385 A1 | 6/2008 | Jeong |
| 2008/0189589 A1 | 8/2008 | Park |
| 2008/0263425 A1 | 10/2008 | Lakkis |
| 2009/0106625 A1 | 4/2009 | Jun |
| 2009/0113276 A1 | 4/2009 | Radosavljevic |
| 2009/0125780 A1 | 5/2009 | Taylor et al. |
| 2010/0070818 A1 | 3/2010 | Ulriksson |
| 2010/0122142 A1 | 5/2010 | Sun |
| 2011/0307755 A1 | 12/2011 | Livshitz |

*Primary Examiner* — Sam Rizk
(74) *Attorney, Agent, or Firm* — Procopio, Cory, Hargreaves & Savitch LLP; Noel C. Gillespie

(57) ABSTRACT

Provided is a method for generating a single rate or multi-rate highly structured low density parity check, encoding a data stream with the generated LDPC matrix for transmission in a wireless communication system, and for efficient LDPC decoding at a receiver.

27 Claims, 14 Drawing Sheets

$$\mathbf{H}^{Left}_{M \times M} = $$

| 502 | | 504 | | 506 | | 508 | | 500 |
|---|---|---|---|---|---|---|---|---|
| 40 | - | 20 | - | 39 | - | 18 | - | |
| - | 25 | - | 6 | - | 23 | - | 34 | |
| - | 31 | 19 | - | - | 41 | 34 | - | |
| 25 | - | - | 29 | 10 | - | - | 16 | |
| - | 30 | - | 5 | - | 15 | - | 22 | |
| 6 | - | 32 | - | 34 | - | 19 | - | |
| 24 | - | - | 21 | 40 | - | - | 21 | |
| - | 1 | 14 | - | - | 0 | 0 | - | |

FIG. 5A $$\mathbf{H}^{Right}_{M \times M} = $$

| 552 | | 554 | | 556 | | 558 | | 550 |
|---|---|---|---|---|---|---|---|---|
| - | 5 | 16 | - | - | 37 | 15 | - | 572 / 574 |
| 38 | - | - | 10 | 25 | - | - | 37 | 576 / 578 |
| 18 | - | 12 | - | 11 | - | 3 | - | 568 |
| - | 19 | - | 22 | - | 27 | - | 29 | |
| 14 | - | - | 8 | 41 | - | - | 9 | 570 |
| - | 31 | 2 | - | - | 19 | 17 | - | |
| - | 17 | - | 38 | - | 41 | - | 5 | |
| 4 | - | 36 | - | 13 | - | 29 | - | |
| 560 | | 562 | | 564 | | 566 | | |

FIG. 5B

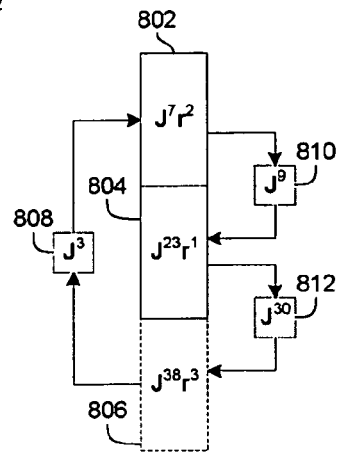
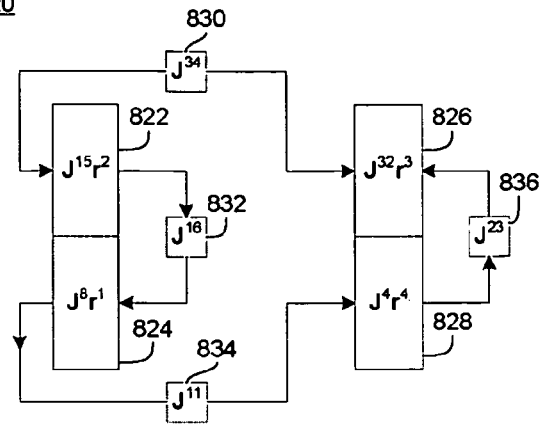
FIG. 8A
FIG. 8B
FIG. 8C
FIG. 8D $$\mathbf{H}^{Right,masked}_{M \times M} =$$

| 902 | | 904 | | 906 | | 908 | |
|---|---|---|---|---|---|---|---|
| - | - | - | - | - | 37 | 15 | - |
| - | - | - | - | 25 | - | - | 37 |
| - | - | 12 | - | 11 | - | 3 | - |
| - | - | - | 22 | - | 27 | - | 29 |
| - | - | - | 8 | 41 | - | - | - |
| - | - | 2 | - | - | 19 | - | - |
| - | 17 | - | - | - | 41 | - | 5 |
| 4 | - | - | - | 13 | - | 29 | - |

FIG. 9

METHOD AN APPARATUS FOR LOW DENSITY PARITY CHECK CODES ENCODING AND DECODING

BACKGROUND

1. Field

Certain aspects of the present disclosure generally relate to low density parity check codes and, more particularly, to a method for constructing a parity check matrix, encoding and decoding.

2. Background

With the explosive growth in multimedia and broadband services over wired and wireless networks, significant effort has been made to apply highly efficient error correcting coding to data transmission over noisy and impaired channels. Low Density Parity Check (LDPC) codes have emerged as one of the most promising error correcting codes due to their offering of higher speeds with significantly lower complexity by taking advantage of the natural parallelism of LDPC codes. In fact, LDPC coded were the first to allow data transmission close to the theoretical limit, e.g., the Shannon limit.

A Low Density Parity Check (LDPC) codes is an error correcting code that is used to detect and correct errors introduced during transmission over a noisy and impaired channel. A binary LDPC code is a block error-correcting code based on a sparse Parity Check Matrix (PCM) H, i.e. matrix H contains mostly 0's and only a small number of 1's or equivalently H has low density of 1's. An (N, K) LDPC code is a linear block code whose PCM $H_{M \times N}$ contains M rows where M=N−K and N columns. A regular (N, K, $W_c$, $W_r$) LDPC code is a linear block code for which the PCM $H_{M \times N}$ contains exactly $W_c$ 1's per column and exactly $W_r = W_c N/M$ 1's per row, where the low density constraints implies that $W_r << N$ and $W_c << M$. The code rate is Rate=K/N=1−M/N=1−$W_c$/$W_r$. If the number of ones in each row or column is not constant than such codes are called irregular LDPC codes.

An LDPC code can be defined in both matrix form and graphical form. An LDPC code can be graphically defined by a Tanner bipartite graph corresponding to the PCM $H_{M \times N}$. Not only do such graphs provide a complete representation of the code, they also describe the decoding algorithm explained in more detail below. A Tanner bipartite graph is essentially a visual representation of the PCM $H_{M \times N}$. A M×N PCM $H_{M \times N}$ defines a code in which the N bits of each codeword satisfy a set of M parity-check constraints. The Tanner graph contains N bit-nodes (also called variable nodes); one for each bit, and M check-nodes (also called parity nodes); one for each of the parity check equations. The check-nodes are connected via edges (also called arcs) to the bit nodes they check. Specifically, a branch connects check-node i to bit-node j if and only if the i-th parity check equation involves the j-th bit, or more succinctly, if and only if $H_{i,j}$=1. The graph is said to be bipartite because there are two distinct types of nodes, bit-nodes and check-nodes, and there are no direct connection between any two nodes of the same type.

An LDPC code may also be defined using a generator matrix $G_{N \times K}$. A message (also called dataword) $d_{M \times 1}$ comprising M bits is encoded into a codeword as follows $$c_{N \times 1} = G_{N \times K} d_{K \times 1}$$

Alternatively, the dataword $d_{M \times 1}$ can be encoded into a codeword $c_{N \times 1}$ using the PCM $H_{M \times N}$ by solving for the constraints specified in the following equation $$H_{M \times N} c_{N \times 1} = 0_{M \times 1}$$

An LDPC encoded data stream comprising one or multiple codewords is typically transmitted over a noisy and/or impaired channel. A received word corresponding to a transmitted codeword may be contaminated with errors. An LDPC decoder is used to detect and/or correct the errors. LDPC decoding is based on iterative decoding using a message-passing algorithm as an alternative to an optimal yet highly complex maximum-likelihood decoding. Received words are processed iteratively over a Tanner graph wherein messages are exchanged iteratively between bit nodes and parity nodes until a stopping criterion is satisfied.

Conventional LDPC PCMs are random in nature which leads to fully parallel LDPC encoders and decoders. Fully parallel LDPC decoding means that all the messages to and from parity nodes have to be computed at every iteration in the decoding process. This leads to large complexity, increased power and increased cost. Serializing part of the decoder by sharing a number of parity node processing elements (PNPE) is one option for reducing some of the overhead involved; however, serializing part of the decoder would result in stringent memory requirements to store the messages and in an interconnection complexity bottleneck network, i.e. complex interconnects and multiplexing between Variable Nodes Processing Elements (VNPEs), PNPEs and memory.

Further, if different coding rates are to be supported, then the encoder and decoder become even more complex in terms of memory size and architecture, speed, interconnect and multiplexing complexity.

Therefore, there is a need in the art for a method of high speed multi-rate LDPC encoding and decoding that avoids the drawbacks of the standard LDPC encoding and standard message-passing decoding algorithms.

SUMMARY

Certain aspects provide a method for wireless and wired communications. The method generally includes encoding at least one of the fields of a data stream with one an LDPC encoder wherein the corresponding LDPC matrix comprises at least on matrix block that admits a cyclic sub-block shift registers with a set of fixed permuters, and transmitting the spread data stream.

Certain aspects provide a method for wireless and wired communications. The method generally includes receiving a data stream wherein at least one of the fields LDPC encoded, and decoding the encoded fields using an LDPC decoder comprising one or multiple a cyclic sub-block shift registers with a set of fixed permuters.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5A illustrates an example left parity check matrix according to one aspect of the present disclosure.

FIG. 5B illustrates an example right parity check matrix according to one aspect of the present disclosure.

FIG. 8A illustrates an example of a cyclic sub-block shift register according to one aspect of the present disclosure.

FIG. 8B illustrates another example of a cyclic sub-block shift register according to one aspect of the present disclosure.

FIG. 8C illustrates the block matrix corresponding to the block matrix in FIG. 8A according to one aspect of the present disclosure.

FIG. 8D illustrates the block matrix corresponding to the block matrix in FIG. 8B according to one aspect of the present disclosure.

FIG. 9 illustrates a masking example of a block matrix according to one aspect of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope and spirit of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various broadband wireless and wired communication systems, including communication systems that are based on a Single Carrier (SC) transmission and Orthogonal Frequency Division Multiplexing/multiple Access OFDM(A). Aspects disclosed herein may be advantageous to systems employing Ultra Wide Band (UWB) signals including millimeter-wave signals, Code Division Multiple Access (CDMA) signals, and OFDM. However, the present disclosure is not intended to be limited to such systems, as other coded signals may benefit from similar advantages.

Figure 1:
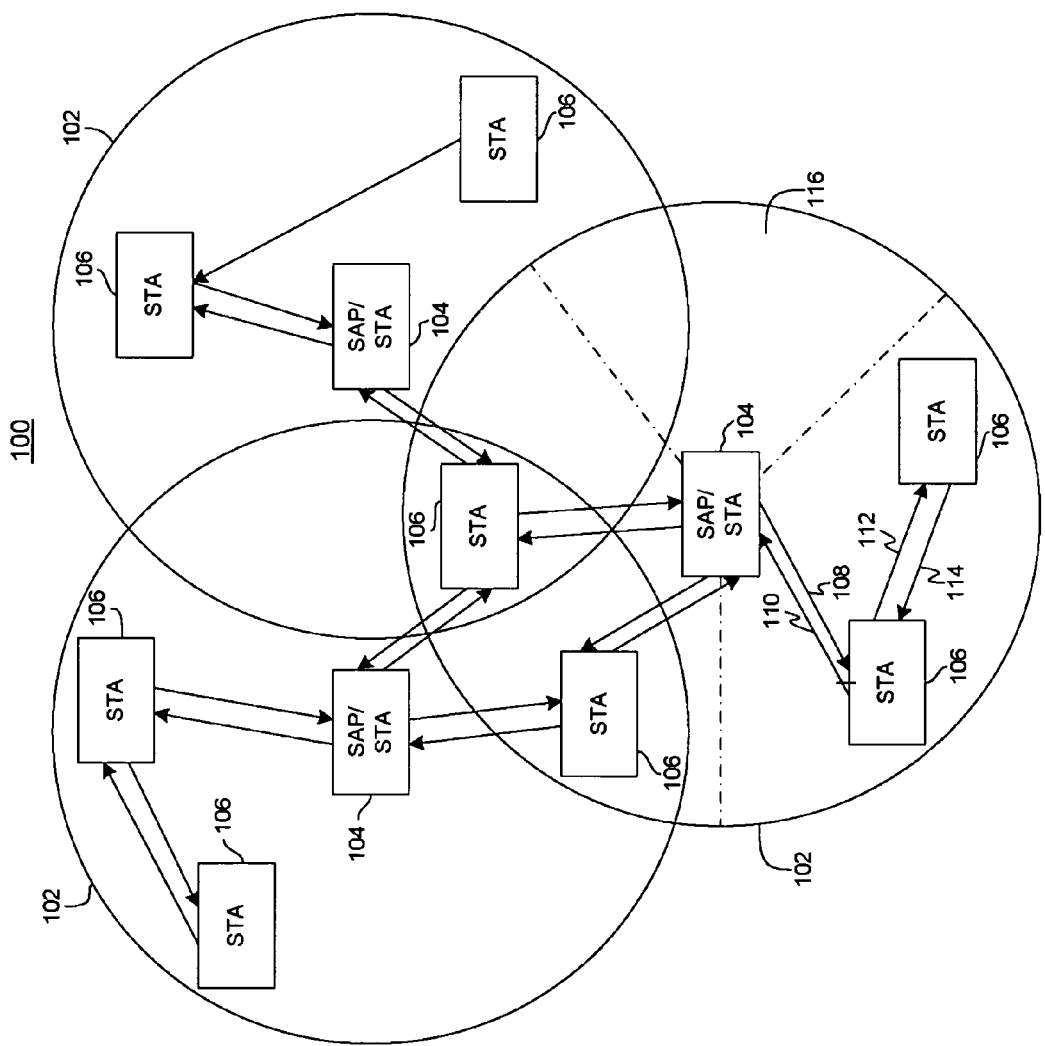
FIG. 1 illustrates an example wireless communication system, in accordance with certain aspects of the present disclosure.

FIG. 1 illustrates an example of a wireless communication system 100 in which aspects of the present disclosure may be employed. The wireless communication system 100 may be a broadband wireless communication system. The wireless communication system 100 may provide communication for a number of Basic Service Sets (BSSs) 102, each of which may be serviced by a Service Access Point (SAP) 104. A SAP 104 may be a fixed station or a mobile station that communicates with Stations (STAs) 106. A BSS 102 may alternatively be referred to as cell, piconet or some other terminology. A SAP 104 may alternatively be referred to as base station, a piconet controller, a Node B or some other terminology.

FIG. 1 depicts various stations 106 dispersed throughout the system 100. The stations 106 may be fixed (i.e., stationary) or mobile. The stations 106 may alternatively be referred to as remote stations, access terminals, terminals, subscriber units, mobile stations, devices, user equipment, etc. The stations 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the SAPs 104 and the STAs 106 and betweens STAs 106 themselves. For example, signals may be sent and received between the SAPs 104 and the STAs 106 in accordance with CDMA technique and signals may be sent and received between STAs 106 in according with OFDM technique. If this is the case, the wireless communication system 100 may be referred to as a hybrid CDMA/OFDM system.

A communication link that facilitates transmission from a SAP 104 to a STA 106 may be referred to as a downlink (DL) 108, and a communication link that facilitates transmission from a STA 106 to a SAP 104 may be referred to as an uplink (UL) 110. Alternatively, a downlink 108 may be referred to as a forward link or a forward channel, and an uplink 110 may be referred to as a reverse link or a reverse channel. When two STAs communicate directly with each other, a first STA will act as the master of the link, and the link from the first STA to the second STA will be referred to as downlink 112, and the link from the second STA to the first STA will be referred to as uplink 114.

A BSS 102 may be divided into multiple sectors 112. A sector 116 is a physical coverage area within a BSS 102. SAPs 104 within a wireless communication system 100 may utilize antennas that concentrate the flow of power within a particular sector 116 of the BSS 102. Such antennas may be referred to as directional antennas.

Figure 2:
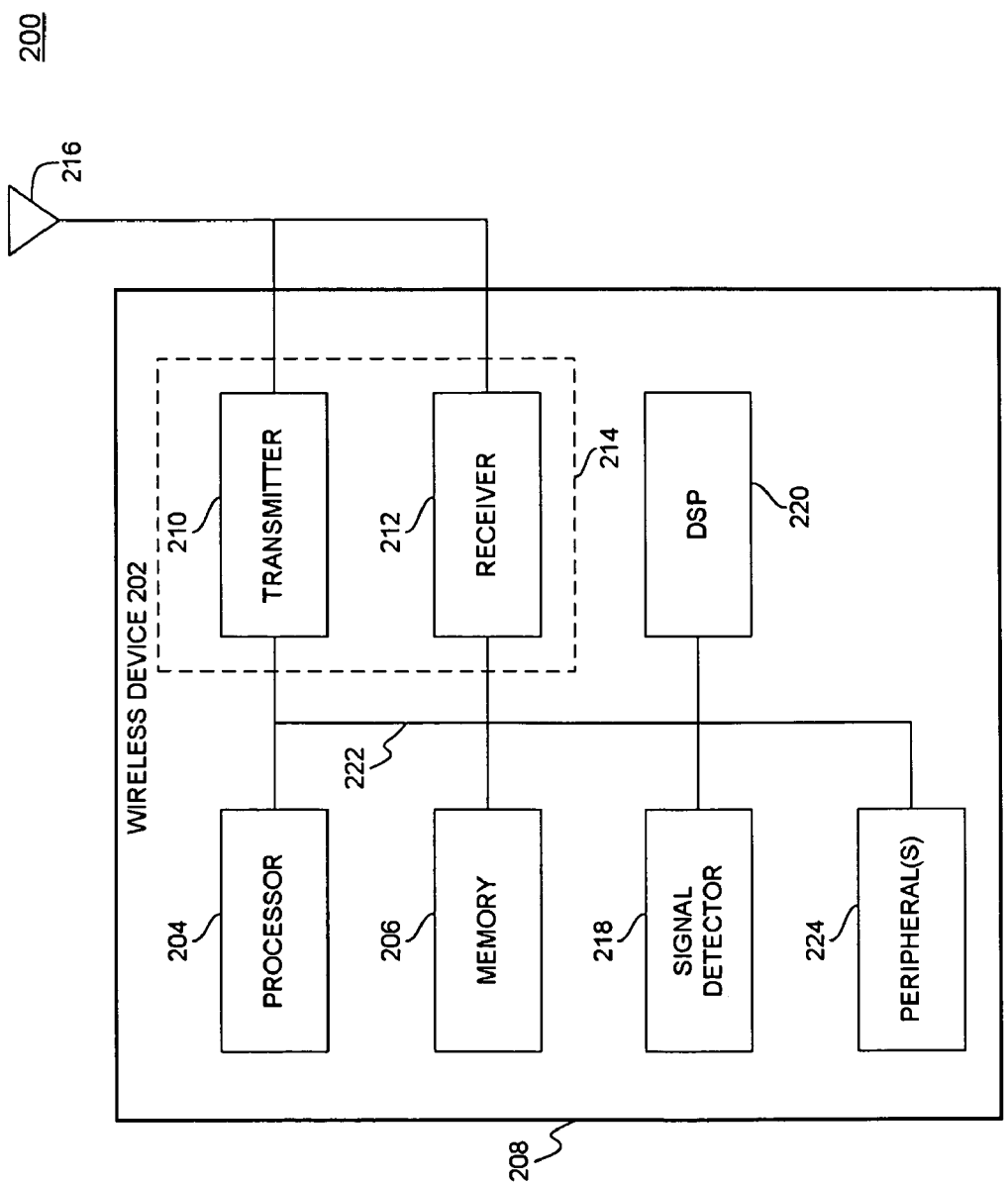
FIG. 2 illustrates various components that may be utilized in a wireless device in accordance with certain aspects of the present disclosure.

FIG. 2 illustrates various components that may be utilized in a wireless device 210 that may be employed within the wireless communication system 100. The wireless device 210 is an example of a device that may be configured to implement the various methods described herein. The wireless device 202 may be a SAP 104 or a STA 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may include one or more wired peripherals 224 such as USB, HDMI, or PCIE. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
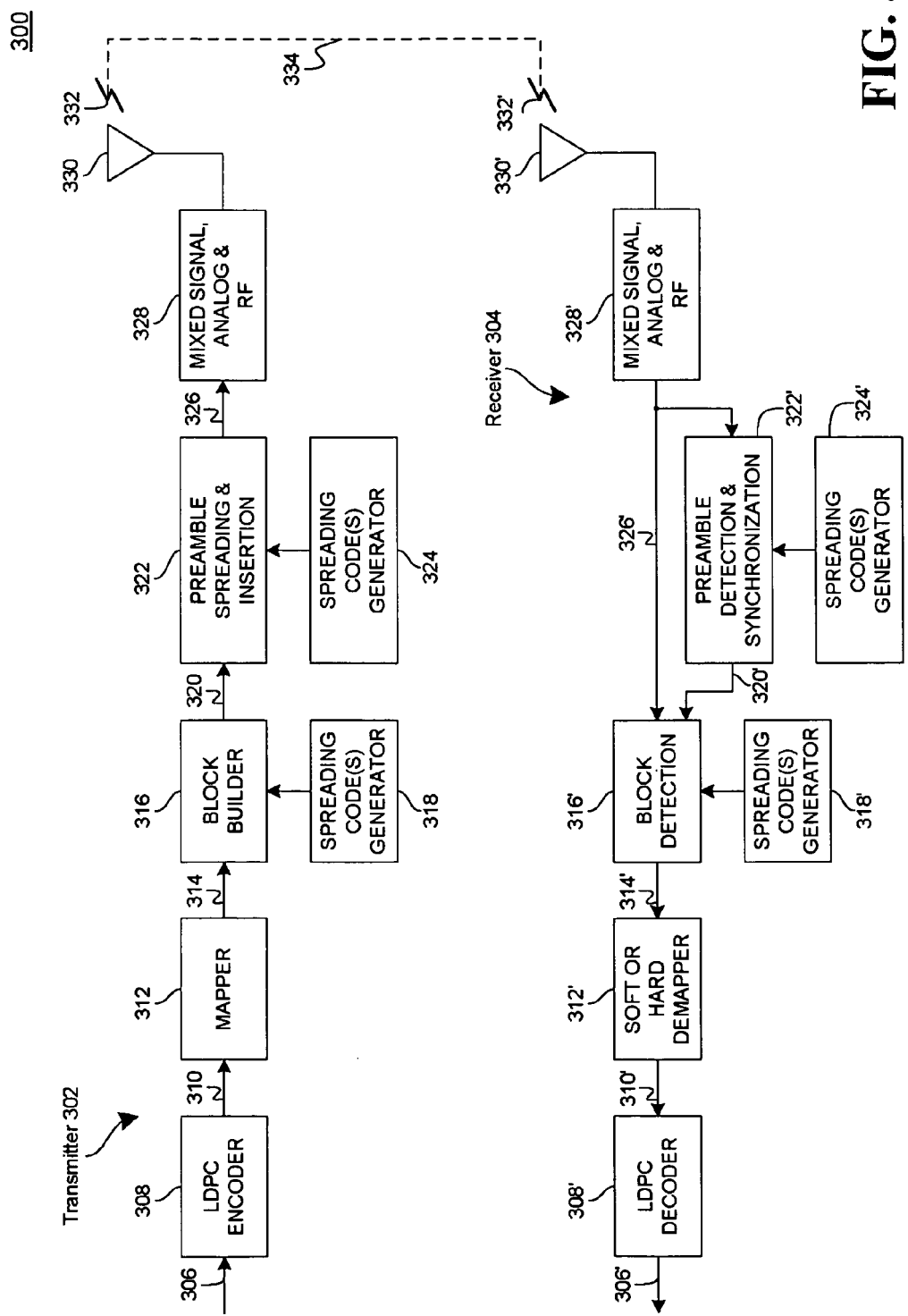
FIG. 3 illustrates an example transceiver that may be used within a wireless communication system in accordance with certain aspects of the present disclosure.

FIG. 3 illustrates an example of a transmitter 302 that may be used within a wireless communication system 100 that utilizes CDMA or some other transmission technique. Portions of the transmitter 302 may be implemented in the transmitter 210 of a wireless device 202. The transmitter 302 may be implemented in a base station 104 for transmitting data 330 to a user terminal 106 on a downlink 108. The transmitter 302 may also be implemented in a station 106 for transmitting data 330 to a service access point 104 on an uplink 110.

Data 306 to be transmitted are shown being provided as input to an LDPC encoder 308. The LDPC encoder encodes the data 306 by adding redundant bits. The LDPC encoder 308 outputs an encoded data stream 310. The encoded data stream 310 is input to the mapper 314. The mapper 314 may map the encoded data stream onto constellation points. The mapping may be done using some modulation constellation, such as binary phase-shift keying (BPSK), quadrature phase-shift keying (QPSK), 8 phase-shift keying (8PSK), quadrature amplitude modulation (QAM), constant phase modulation (CPM), etc. Thus, the mapper 312 may output a symbol stream 314, which may represents one input into a block builder 310. Another input in the block builder 310 may be comprised of one or multiple of spreading codes produced by a spreading-codes generator 318.

The block builder 310 may be configured for partitioning the symbol stream 314, into sub-blocks and creating OFDM/OFDMA symbols or single carrier sub-blocks. The block builder may append each sub-block by a guard interval, a cyclic prefix or a spreading sequence from the spreading codes generator 318. Furthermore, the sub-blocks may be spread by one or multiple spreading codes from the spreading codes generator 318.

The output 320 may be pre-pended by a preamble 322 generated from one or multiple spreading sequences from the spreading codes generator 324. The output stream 326 may then be converted to analog and up-converted to a desired transmit frequency band by a radio frequency (RF) front end 328 which may include a mixed signal and an analog section. An antenna 330 may then transmit the resulting signal 332.

FIG. 3 also illustrates an example of a receiver 304 that may be used within a wireless device 202 that utilizes CDMA or OFDM/OFDMA. Portions of the receiver 304 may be implemented in the receiver 212 of a wireless device 202. The receiver 304 may be implemented in a station 106 for receiving data 306 from a service access point 104 on a downlink 108. The receiver 304 may also be implemented in a base station 104 for receiving data 306 from a user terminal 106 on an uplink 110.

The transmitted signal 332 is shown traveling over a wireless channel 334. When a signal 332' is received by an antenna 330', the received signal 332' may be down-converted to a baseband signal by an RF front end 328' which may include a mixed signal and an analog portion. Preamble detection and synchronization component 322' may be used to establish timing, frequency and channel synchronization using one or multiple correlators that correlate with one or multiple spreading codes generated by the spreading code(s) generator 324'.

The output of the RF front end 326' is input to the block detection component 316' along with the synchronization information from 322'. When OFDM/OFDMA is used, the block detection block may perform cyclic prefix removal and fast Fourier transform (FFT). When single carrier transmission is used, the block detection block may perform de-spreading and equalization.

A demapper 312' may perform the inverse of the symbol mapping operation that was performed by the mapper 312 thereby outputting soft or hard decisions 310'. The soft or hard decisions 310' are input to the LDPC decoder which provides an estimate data stream 306'. Ideally, this data stream 306' corresponds to the data 306 that was provided as input to the transmitter 302.

The wireless system 100 illustrated in FIG. 1 may be a UWB/millimeter wave system operating in the band including 57-64 GHz unlicensed band specified by the Federal Communications Commission (FCC).

Low Density Parity Check Codes

In the descriptions that follow, certain example parameters, values, etc., are used; however, it will be understood that the disclosure described herein is not necessarily limited by these examples. Accordingly, these examples should not be seen as limiting the disclosure in any way. Further, the embodiments of an LDPC encoder and an LDPC decoder described herein can be applied to many different types of systems implementing a variety of protocols and communication techniques. Accordingly, the embodiments should not be seen as limited to a specific type of system, architecture, protocol, air interface, etc. unless specified.

In order to illustrate the operation of LDPC codes, the following PCM example is provided $$H_{3\times 6} = \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix}$$

As can be seen, the PCM $H_{3\times 6}$ is low density, or sparse. A dataword $d_{3\times 1}$ may be encoded into a codeword $c_{6\times 1}$ such that $H_{3\times 6}c_{6\times 1}=0_{3\times 1}$. The encoding may be done in a systematic way, i.e. the codeword $c_{6\times 1}$ is partitioned into two vectors, the dataword $d_{3\times 1}$ and a parityword $p_{3\times 1}$ as follows $$c_{6\times 1} = \begin{bmatrix} d_{3\times 1} \\ p_{3\times 1} \end{bmatrix}$$

Expanding the constraint $H_{3\times 6}c_{6\times 1}=0_{3\times 1}$, we obtain $$\begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix} \begin{bmatrix} d_1 \\ d_2 \\ d_3 \\ p_1 \\ p_2 \\ p_3 \end{bmatrix} = 0_{3\times 1}$$

Solving for the parityword bits $\{p_m\}$ for m=1, 2, 3 we obtain $p_1 = d_1$ $p_2 = d_1 + d_3$ $p_3 = d_1 + d_2$ Thus, for example, for the data word $d_{3\times 1}=[010]^T$ where "T" is the transpose operator, the parityword is $p_{3\times 1}=[001]^T$ and the codeword is $c_{6\times 1}=[010001]^T$.

The normalized received vector, denoted $r_{6\times 1}$, may be a multilevel signal corresponding to the transmitted codeword $c_{6\times 1}$, and may be modeled as $$r_{6\times 1} = \frac{2}{\sigma^2}(1-2c_{6\times 1}) + \frac{2}{\sigma^2}w_{6\times 1}$$

where $w_{6\times 1}$ is a vector modeling the channel noise, imperfections, impairments and interference, and $\sigma^2$ is the variance of the noise samples $\{w_n\}$. The first parity check node or equation, corresponding to the first row of PCM $H_{3\times 6}$ will check received samples $r_1$, $r_3$, and $r_5$. The second parity check node, i.e., the second row of $H_{3\times 6}$, checks for received samples $r_2$, $r_4$, and $r_6$, and the third parity check node checks samples $r_1$, $r_2$, and $r_6$. The first and second parity check equations are considered to be orthogonal, because they involve mutually exclusive sets of samples.

Figure 4A:
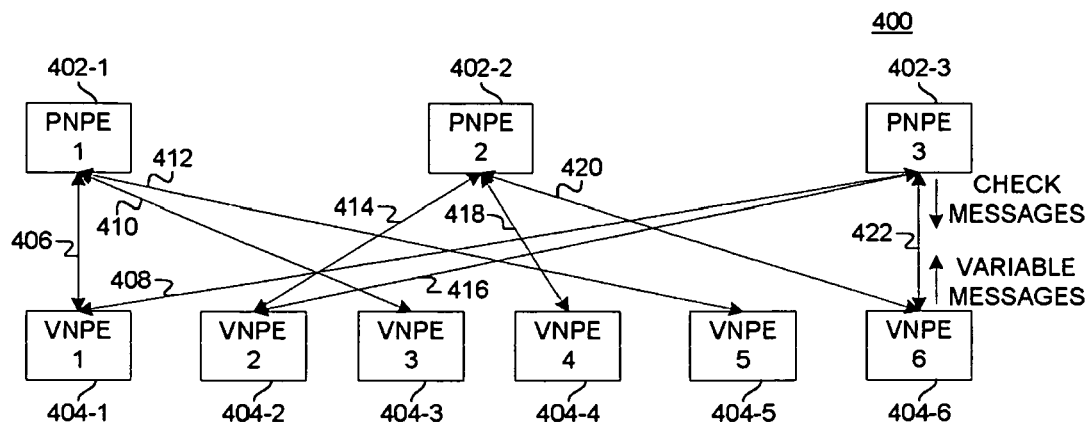
FIG. 4A illustrates an LDPC decoder on graph using variable and parity node processor elements.

FIG. 4A is a diagram illustrating a message passing algorithm on graph that may be used in the example above. The graph of FIG. 4A. Has three Parity check Node Processor Elements (PNPEs) 402-1, 402-2, and 402-3, which correspond to the three parity check equations. i.e. the three rows of PCM $H_{3\times 6}$, and six Variable Node Processor Elements (VNPEs) 404-1, 404-2, 404-3, 404-4, 404-5, and 404-6 which correspond to the six bits of codeword $c_{6\times 1}$. PNPEs 402-1, 402-2, and 402-3 are connected with VNPEs 404-1, 404-2, 404-3, 404-4, 404-5, and 404-6, via edges 406, 408, 410, 412, 414, 416, 418, 420, and 422 as dictated by the entries in $H_{3\times 6}$. In other words, each edge 406, 408, 410, 412, 414, 416, 418, 420, and 422 should correspond to a 1 in $H_{3\times 6}$.

In an LDPC decoder, the operations of the parity check nodes and variable nodes may be implemented by processor elements as indicated above. An LDPC decoder is than an iterative decoder that implements a message passing algorithm defined by PCM $H_{3\times 6}$.

Figure 4B:
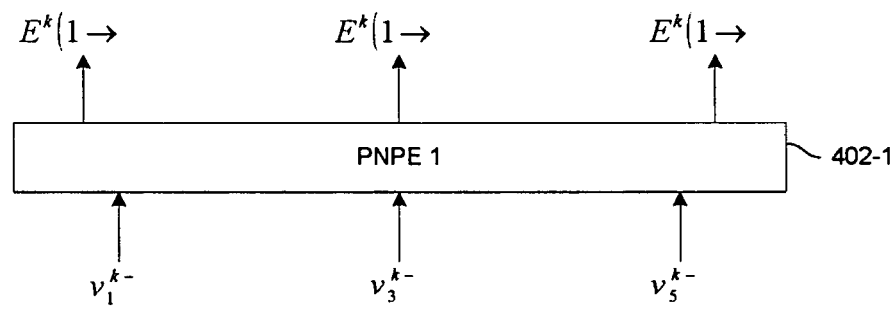
FIG. 4B illustrates a parity node processor element.

FIG. 4B illustrates the operation of PNPE 402-1. First the LDPC decoder will be initialize the variable samples $v_1$, $v_2$, $v_6$ of VNPEs 404-1, 404-2, 404-3, 404-4, 404-5, and 404-6, with $r_1, r_2, \ldots, r_6$, i.e. with the samples of the received vector. Referring to FIG. 3B, $v_1^{k-1}$, $v_3^{k-1}$, and $v_5^{k-1}$ are the variable messages sent from VNPEs 404-1, 404-3, and 404-5, to PNPE 402-1 at the $(k-1)^{th}$ iteration. PNPE 402-1 collects incoming variable messages $v_1^{k-1}$, $v_3^{k-1}$, and $v_5^{k-1}$ from VNPEs 404-1, 404-3, and 404-5 involved in the first parity check equation, computes the a posteriori Log Likelihood Ratio (LLR) for their parity and passes messages $E^k$ (1→n) where n takes on the values 0, 2, and 4 back to VNPEs 404-1, 404-3, and 404-5. For example $E^k$ (1→3) represents the message sent back from PNPE 402-1 to VNPE 404-3 at the $k^{th}$ iteration.

As shown by R. G. Gallager, "Low-Density Parity-check Nodes," IRE Trans. Inform. Theory, vol. IT-8, pp. 21-28, January 1962, the parity node messages produced by PNPE 402-1 can be computed as follows $$E^k(1 \to 1) = 2\tanh^{-1}\left[\tanh\left(\frac{v_3^{k-1}}{2}\right)\tanh\left(\frac{v_5^{k-1}}{2}\right)\right]$$

$$E^k(1 \to 3) = 2\tanh^{-1}\left[\tanh\left(\frac{v_1^{k-1}}{2}\right)\tanh\left(\frac{v_5^{k-1}}{2}\right)\right]$$

$$E^k(1 \to 5) = 2\tanh^{-1}\left[\tanh\left(\frac{v_1^{k-1}}{2}\right)\tanh\left(\frac{v_3^{k-1}}{2}\right)\right]$$

Thus, PNPE 402-1 can be configured to implement the above equations or any approximation to the above equations such as the min-sum approximation, the scaled min-sum approximation, the offset min-sum approximation, etc.

Figure 4C:
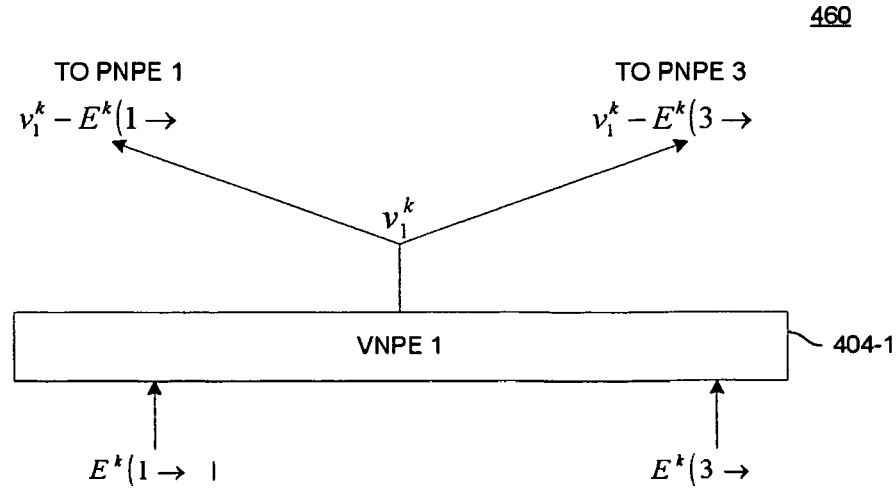
FIG. 4C illustrates a variable node processor element.

FIG. 4C illustrates the operation of a VNPE 404-1. Referring to FIG. 4C, VNPE 404-1 receives inputs messages from PNPEs 402-1 and 402-3 and produces variable messages to be sent back to the same PNPEs 402-1 and 402-3. The VNPE can be configured to update the variable $v_1^k$ as follows $$v_1^k = r_1 + E^k(1 \to 1) + E^k(3 \to 1)$$

The iterative decoder may be stopped according to a stopping criterion such as if the hard decisions taken on the multilevel variables $\{v_n^k\}$ with n=1, 2, . . . , 6 meet the parity check equations, i.e. $H_{3\times 6} v_{6\times 1}^k = 0_{3\times 1}$, or if a certain defined number or iterations is surpassed.

The message-passing decoder for a binary code with a PCM $H_{M\times N}$ can be summarized by introducing the index sets $C_n = \{m: H_{m,n} = 1\}$ and $R_m = \{n: H_{m,n} = 1\}$. The index set $C_n$ is the set of all row indexes for which $H_{m,n} = 1$, i.e. the index of all parity check equations involving variable node number n, and the index set $R_m$ is the set of all column indexes for which $H_{m,n} = 1$, i.e. the index of all variable nodes involved in the $m^{th}$ parity check equation. Let $E^k(m \to n)$ denote the parity node message from PCNE number m to VNPE number n during the $k^{th}$ iteration, and let $v_n^k$ denote an estimate of the $n^{th}$ a-posteriori LLR of bit number n after k iterations. Using the compact notation n=1:N which means n=1, 2, . . . , N, the message passing decoder may be summarized as follows

```
/ Initialization /
k = 0; v_n^0 = 0, for n = 1:N;
/ Iterations /
for k = 1:k_max
    / Parity-node update /
    for m = 1:M and n ∈ R_m
```

$$E^k(m \to n) = 2\tanh^{-1}\left[\prod_{i \in R_m, i \neq n} \tanh\left(\frac{v_i^{k-1} - E^{k-1}(m \to i)}{2}\right)\right]$$

```
    / Variable-node update /
    for n = 1:N
        v_n^k = r_n + Σ_{m ∈ C_n} E^k(m → n)
end;
```

In the min-sum approximation, the computation of the edge messages $E^k(m \to n)$ are replaced by $$E^k(m \to n) = \min_{i \in R_m, i \neq n} |v_i^{k-1} - E^{k-1}(m \to i)| \prod_{i \in R_m, i \neq n} \text{sign}\left(\frac{v_i^{k-1} - E^{k-1}(m \to i)}{2}\right)$$

where the sign function is +1 if its argument is $\geq 0$ and −1 if its argument is <0, and min is the minimum. The min-sum approximation may be further modified by replacing the minimum in the above equation with $$\max\left(\alpha \times \min_{i \in R_m, i \neq n} |v_i^{k-1} - E^{k-1}(m \to i)| - \beta, 0\right)$$

where α is a scaling factor often chosen to be less than one and β is an offset.

It will be understood that the decoder described above may be implemented using hardware and/or software configured appropriately and that while separate PNPEs and VNPEs are described, these processors may be implemented by a single processor, such as an Application Specific Integrated Circuit (ASIC); however, as mentioned above, implementation of an LDPC processor such as that described in FIGS. 3A, 3B, and 3C, can results in a large complex circuit with stringent memory requirements, an interconnect network and multiplexers that can lead to bottlenecks. These issues are exacerbated if multiple coding rates are to be implemented.

Highly Structured Low Density Parity Check Codes

The embodiments described below allow for more practical implementation of an LDPC encoder and decoder. For example, according to one aspect of the disclosure, a highly structured PCM $H_{M\times N}$, where different sub-blocks have cyclic sub-block shift registers representations wherein different memory components are connected by fixed permuters, and may be used to facilitate encoding and to solve the memory, interconnect and multiplexing bottlenecks at the decoder.

According to one aspect of the disclosure, the received vector $r_{N\times 1}$ is partitioned into L block vectors of length N/L each, and the PCM matrix $H_{M\times N}^{(1/2)}$ is partitioned accordingly into $L_r \times L_c$ block matrices. For simplicity, we shall assume in the following block column matrices, i.e. $L_r = 1$, and $L_c = L$, $$r_{(N/L)\times L} = [r_{(N/L)\times 1}^1 \; r_{(N/L)\times 1}^2 \; \ldots \; r_{(N/L)\times 1}^L]$$

$$H_{M\times N}^{(1/2)} = [H_{M\times(N/L)}^1 \; H_{M\times(N/L)}^2 \; \ldots \; H_{M\times(N/L)}^L]$$

where "T" is the transpose operator, the received vector $r_{N\times 1}$ is written into matrix form $r_{(N/L)\times L}$, and the first block vectors $r_{(N/L)\times 1}^l$ for l=1:L contain successive blocks of N/L elements of vector $r_{N\times 1}$. The following exemplary parameters shall be used to clarify the construction procedure, rate=½, N=67, and L=2; therefore M=K=N/2=336 and N/L=336.

$$r_{M\times 2} = [r_{M\times 1}^{Left} \; r_{M\times 1}^{Right}]$$

$$H_{M\times N}^{(1/2)} = [H_{M\times M}^{Left} \; H_{M\times M}^{Right}]$$

The processing of $r_{M\times 1}^{Left}$ and $r_{M\times 1}^{Right}$ use the same procedures and therefore we shall use block vector $x_{M\times 1}$ to refer to either one of them whenever no distinction between the two is required, and the construction and partitioning of $H_{M\times M}^{Left}$ and $H_{M\times M}^{Right}$ use the same procedures and therefore we shall use block matrix $G_{M\times M}$ to refer to either one of them whenever no distinction between the two is required.

Next, according to one aspect of the disclosure, block vector $x_{M\times 1}$ is portioned into P sub-block vectors of length l=M/P, and bock matrix $G_{M\times M}$ is partitioned into P×P square sub-block matrices.

$$x_{l\times P} = [x_{l\times 1}^1 \; x_{l\times 1}^2 \; \ldots \; x_{l\times 1}^P]$$

$$G_{M\times M} = \begin{bmatrix} G_{l\times l}^{1,1} & G_{l\times l}^{1,2} & \ldots & G_{l\times l}^{1,P} \\ G_{l\times l}^{2,1} & G_{l\times l}^{2,2} & \ldots & G_{l\times l}^{2,P} \\ \vdots & \vdots & \ddots & \vdots \\ G_{l\times l}^{P,1} & G_{l\times l}^{P,2} & \ldots & G_{l\times l}^{P,P} \end{bmatrix}$$

where, as above, the sub-block vectors $x_{l\times 1}^p$ for p=1:P, contain successive block of I elements of vector $x_{M\times 1}$, and are collected together into matrix $x_{l\times P}$. In the following, an example value of 4 for the parameter P shall be used for illustration purposes of the decoder operation and construction of PCM $H_{M \times N}^{(1/2)}$. Therefore, for the above example I=84.

According to one aspect of the disclosure, a block matrix $G_{M \times M}$, may be fully specified by one of the block rows, for example the first block row, i.e. the sub-blocks $G_{I \times I}^{1,p}$ with p=1:P, along with a set of fixed permuters connecting each of the vectors $x_{I \times 1}^{p}$ with p=1:P in a sub-block shift-register. This is further explained below.

According to one aspect of the disclosure, each of the sub-block vectors $x_{I \times 1}^{p}$ with p=1:P is partitioned into Q element vectors of length S=I/Q each, and each of the sub-block matrices $G_{I \times I}^{P_r,P_c}$ is partitioned into Q×Q element matrices. In a preferred embodiment of the present disclosure, one and only one element matrix in each sub-block row of a sub-block matrix may be a non-zero matrix, and one and only one element matrix in each sub-block column of a sub-block matrix may be a non-zero matrix.

$$x_{I \times 1}^{p} = \begin{bmatrix} x_{S \times 1}^{p,1} \\ x_{S \times 1}^{p,2} \\ \vdots \\ x_{S \times 1}^{p,Q} \end{bmatrix},$$

$$G_{I \times I}^{P_r,P_c} = \begin{bmatrix} G_{S \times S}^{P_r,P_c,1,1} & G_{S \times S}^{P_r,P_c,1,2} & \cdots & G_{S \times S}^{P_r,P_c,1,Q} \\ G_{S \times S}^{P_r,P_c,2,1} & G_{S \times S}^{P_r,P_c,2,2} & \cdots & G_{S \times S}^{P_r,P_c,2,Q} \\ \vdots & \vdots & \ddots & \vdots \\ G_{S \times S}^{P_r,P_c,Q,1} & G_{S \times S}^{P_r,P_c,Q,2} & \cdots & G_{S \times S}^{P_r,P_c,Q,Q} \end{bmatrix}$$

with $p, p_r, p_c$=1:P. In order to clarify this last partitioning, we shall use for illustration purposes non-zero elementary sub-matrices constructed from cyclic shift of an identity matrix. Let J be the left cyclic shift of the identity matrix of size S×S defined by, $$J_{S \times S} = \begin{bmatrix} 0 & 0 & \cdots & 0 & 1 \\ 1 & 0 & \cdots & 0 & 0 \\ 0 & 1 & 0 & \cdots & 0 \\ \vdots & \ddots & \ddots & \ddots & \vdots \\ 0 & \cdots & 0 & 1 & 0 \end{bmatrix}$$

The matrix J has the following properties, $J^0=I$, $J^e=J \times J^{e-1}$, and $J^S=I$ where I is the identity matrix. In order to accommodate the 0 matrix, we define $J^-=0$. Alternatively, the matrix J can be defined as the right cyclic shift of the identity matrix.

According to another aspect of the disclosure, a block matrix $G_{M \times M}$, may be fully specified by a block column, for example the first block column, i.e. the sub-blocks $G_{I \times I}^{p,1}$ with p=1:P, along with a set of fixed permuters connecting the element vectors $x_{S \times 1}^{p,q}$ with q=1:Q, within a sub-vector $x_{I \times 1}^{p}$ with p=1:P in an element block shift-register. This is further explained below.

In the following, an example value of 2 for the parameter Q shall be used for illustration purposes of the decoder operation and construction of PCM $H_{M \times N}^{(1/2)}$. Therefore, for the above example S=42, and $$x_{84 \times 1}^{p} = \begin{bmatrix} x_{42 \times 1}^{p,1} \\ x_{42 \times 1}^{p,2} \end{bmatrix},$$

$$G_{84 \times 84}^{P_r,P_c} = \begin{bmatrix} G_{S \times S}^{P_r,P_c,1,1} & G_{S \times S}^{P_r,P_c,1,2} \\ G_{S \times S}^{P_r,P_c,2,1} & G_{S \times S}^{P_r,P_c,2,2} \end{bmatrix}$$

FIGS. 5A and 5B illustrate examples of block column matrices of $H_{M \times M}^{Left}$ and $H_{M \times M}^{Right}$ according to one aspect of the disclosure, and their partitioning into sub-block matrices and element matrices. So for example, in FIG. 5A, example sub-blocks are 502, 504, 506, and 508, and in FIG. 5B, example sub-blocks are 552, 554, 556, and 558. Sub-block 552 in FIG. 5B is shown partitioned into 2×2 element matrices 572, 574, 576, and 578. The element matrices are shown here in terms of the exponent of cyclic shift matrix $J_{S \times S}$. So for example, element matrix 572 is zero since the entry "–" corresponds to $J_{S \times S}^{-}=0_{42 \times 42}$, element matrix 574 is $J_{42 \times 42}^{5}$, element matrix 576 is $J_{42 \times 42}^{38}$, and element matrix $0_{42 \times 42}$. As it can be seen, only one element in each sub-block row and each sub-block column of sub-block matrix 552 is non-zero. The same applies to all other sub-block matrices in FIGS. 5A and 5B.

According to another aspect of the disclosure, the non-zero element matrices may be chosen as permutation matrices. As an example, for S=4, there are 24 possible permutations, i.e. S!=S×(S−1)×...×1=24. These are listed below in the matrix perm$^{(4)}$ $$perm^{(4)} = \begin{bmatrix} 1,2,3,4; & 1,2,4,3; & 1,3,2,4; & 1,3,4,2; & 1,4,3,2; & 1,4,2,3; \\ 2,1,3,4; & 2,1,4,3; & 2,3,1,4; & 2,3,4,1; & 2,4,3,1; & 2,4,1,3; \\ 3,2,1,4; & 3,2,4,1; & 3,1,2,4; & 3,1,4,2; & 3,4,1,2; & 3,4,2,1; \\ 4,2,3,1; & 4,2,1,3; & 4,3,2,1; & 4,3,1,2; & 4,1,3,2; & 4,1,2,3 \end{bmatrix}$$

The different permutation vectors are separated by a semi-column, i.e. ";" in the above matrix. So if the chosen permutation is number 11, i.e. vector [2, 4, 3, 1], than the non-zero element matrix may be constructed by placing a 1 in the $2^{nd}$ column of the first row, a 1 in the $4^{th}$ column of the $2^{nd}$ row, a 1 in the $3^{rd}$ column of the third row and so on $$\begin{bmatrix} 0 & 0 & 0 & 1 \\ 1 & 0 & 0 & 0 \\ 0 & 0 & 1 & 0 \\ 0 & 1 & 0 & 0 \end{bmatrix}$$

According to one aspect of the disclosure, the sub-block rows in each block matrix, such as block column matrices $H_{M \times M}^{Left}$ and $H_{M \times M}^{Right}$ illustrated in FIGS. 5A and 5B, are chosen to form a cyclic sub-block shift registers wherein different memory components of the cyclic sub-block shift registers are connected by fixed permuters. In order to illustrate the above, consider the initialization the LDPC decoder in accordance to the first block row of block column matrices $H_{M \times M}^{Left}$ and $H_{M \times M}^{Right}$, i.e. in accordance to sub-block matrices 502, 504, 506, and 508 in the first sub-block row of matrix $H_{M \times M}^{Left}$, and sub-block matrices 552, 554, 556, and 558 in the first sub-block row of matrix $H_{M \times M}^{Left}$. In reference to the example above, parameters, the final result of the three partitionings of the received vector $r_{N \times 1}$ shown above can be summarized as follows $$r_{84\times 4}^{Left} = \begin{bmatrix} r_{42\times 1}^1 & r_{42\times 1}^3 & r_{42\times 1}^5 & r_{42\times 1}^7 \\ r_{42\times 1}^2 & r_{42\times 1}^4 & r_{42\times 1}^6 & r_{42\times 1}^8 \end{bmatrix},$$

$$r_{84\times 4}^{Right} = \begin{bmatrix} r_{42\times 1}^9 & r_{42\times 1}^{11} & r_{42\times 1}^{13} & r_{42\times 1}^{15} \\ r_{42\times 1}^{10} & r_{42\times 1}^{12} & r_{42\times 1}^{14} & r_{42\times 1}^{16} \end{bmatrix}$$

According to one embodiment of the present disclosure, the variable nodes in the variable nodes processing elements are stored in L memory blocks (L=2 in the above example), wherein each memory block contains P memory sub-blocks (P=4 in the above example), and wherein each memory sub-block contain Q memory banks (Q=2 in the above example), and wherein each memory bank comprises S memory cells (S=84 in the above example), and wherein each memory cell comprises B-bits where B is the bit width allocated to the variable nodes. The first memory block is capable of storing $r_{84\times 4}^{Left}$, and the second memory bank is capable of storing $r_{84\times 4}^{Right}$. A memory sub-block is capable of storing a column of $r_{84\times 4}^{Left}$ or $r_{84\times 4}^{Right}$, and a memory bank is capable of storing an element vector such as $r_{42\times 1}^1$.

According to one embodiment of the present disclosure, the variable nodes in the variable nodes processing elements are initialized with the above partitioned received vector, rotated according to the first block row of block column matrices $H_{M\times M}^{Left}$ and $H_{M\times M}^{Right}$. This is further illustrated in FIGS. 6A and 6B. The element vectors $r_{42\times 1}^n$ for n=1:8 corresponds to block column matrix $H_{M\times M}^{Left}$ in FIG. 6A and element vectors $r_{42\times 1}^n$ for n=9:16 corresponds to block column matrix $H_{M\times M}^{Right}$ in FIG. 6B. The first sub-block row of the first block row of matrix $H_{M\times M}^{Right}$ has non-zero element matrices in positions, 10, 11, 14, and 15 of the element received vectors, and therefore it checks on $J^5 r^{10}$, $J^{16} r^{11}$, $J^{37} r^{14}$, and $J^{15} r^{15}$. The second sub-block row of the first block row of matrix $H_{M\times M}^{Right}$ has non-zero element matrices in positions, 9, 12, 13, and 16 of the element received vectors, and therefore it checks on $J^{38} r^9$, $J^{10} r^{12}$, $J^{25} r^{13}$, and $J^{37} r^{16}$. Therefore, the first memory block partitioned into 4 memory sub-blocks and the upper 4 memory banks 660, 664, 668, and 672 are loaded with the first set of signals $J^5 r^{10}$, $J^{16} r^{11}$, $J^{37} r^{14}$, and $J^{15} r^{15}$ and the lower 4 memory banks 662, 666, 670, and 674 are loaded with signals $J^{38} r^9$, $J^{10} r^{12}$, $J^{25} r^{13}$, and $J^{37} r^{16}$. Each memory sub-block such as memory sub-block 652 is partitioned into 2 memory banks such as 660 and 662. Each memory bank comprises 42 memory cells, so for example memory bank 660 is initialized with $J^5 r^{10}$ of size 42 samples, and each memory cell comprises B-bits with is typically bigger than the bit width of $r^{10}$ to allow room for variable nodes to grow.

According to one aspect of the disclosure, a square block matrix G, such as block column matrix $H_{M\times M}^{Left}$ or block column matrix $H_{M\times M}^{Right}$, is constructed in such a way that pairs of memory banks in two memory sub-blocks are connected by fixed permuters. The construction details are provided in reference to FIGS. 5, 6 and 7.

Figure 7A:
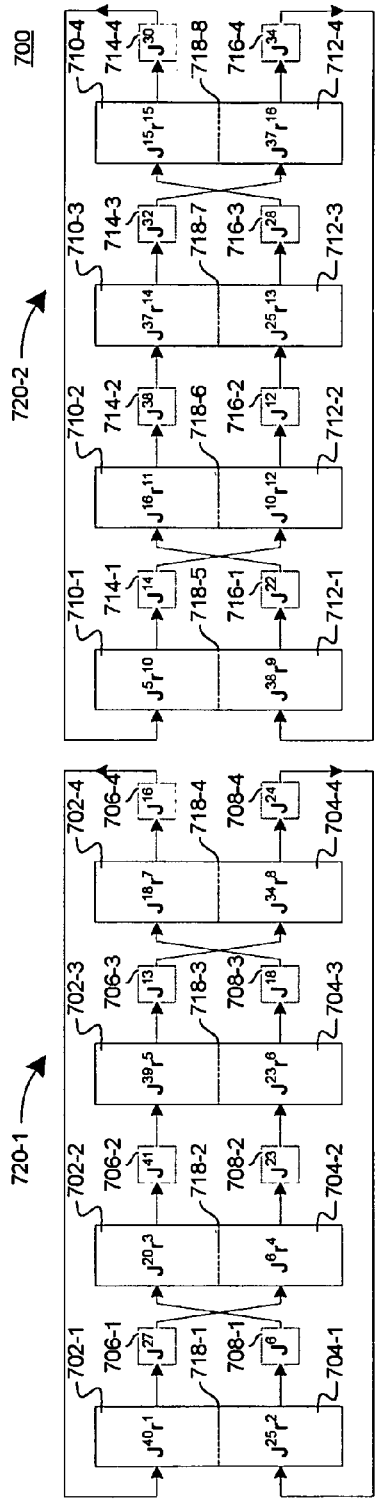
FIG. 7A illustrates a cyclic sub-block shift register representation of a block matrix in accordance to one aspect of the present disclosure.

The initialized memory banks are shown again in FIG. 7A. According to one aspect of the disclosure, Q fixed permuters are used to connect the Q memory banks in one memory sub-block to the Q memory banks in another memory sub-block. Explanation is provided in reference to FIG. 7A. The memory banks 702-1 and 704-1 within the first memory sub-block 718-1 are connected to memory banks 702-2 and 704-2 within the second memory sub-block 718-2 via fixed permuters 706-1 and 708-1.

Memory bank 702-1 in the first memory sub-block 718-1 is connected to memory bank 704-2 in the second memory sub-block 718-2 via fixed permuter 706-1, memory bank 704-2 in the second memory sub-block 718-2 is connected to memory bank 704-3 in the third memory sub-block 718-3 via fixed permuter 708-2, memory bank 704-3 in the third memory sub-block 718-3 is connected to memory bank 702-4 in the fourth memory sub-block 718-4 via fixed permuter 708-3, and memory bank 702-4 in the fourth memory sub-block 718-4 is connected back to memory bank 702-1 in the first memory sub-block 718-1 via fixed permuter 706-4. Therefore, the set of memory banks 702-1, 704-2, 704-3, and 702-4 form a cyclic vector shift register wherein each successive pair of vector registers, i.e. memory banks, are connected via a fixed permuter. In the same way, the set of memory banks 704-1, 702-2, 702-3, and 704-4 form a cyclic vector shift register wherein each successive pair of vector registers, i.e. memory banks, are connected via a fixed permuter. The set of permuters used are, 708-1, 706-2, 706-3, and 708-4. The set of two cyclic vector shift registers, i.e. vector shift register comprising memory banks 702-1, 704-2, 704-3, and 702-4 and permuters 706-1, 708-2, 708-3, and 706-4, and vector shift register comprising memory banks 708-1, 706-2, 706-3, and 708-4 and permuters 708-1, 706-2, 706-3, and 708-4, shall be referred to collectively as cyclic sub-block shift register.

The cyclic sub-block shift registers 720-1 corresponds to block matrix $H_{M\times M}^{Left}$ and cyclic sub-block shift registers 720-2 corresponds to block matrix $H_{M\times M}^{Right}$. The two cyclic sub-block shift registers 720-1 and 720-2 are completely independent and therefore in what follows, it is enough use one of them for exemplary clarifications.

According to one aspect of the disclosure, a block matrix G, such as block column matrix $H_{M\times M}^{Left}$ or block column matrix $H_{M\times M}^{Right}$, may be fully constructed from a cyclic sub-block shift registers. Explanation is provided in reference to 720-1 in FIG. 7A.

Figure 6A:
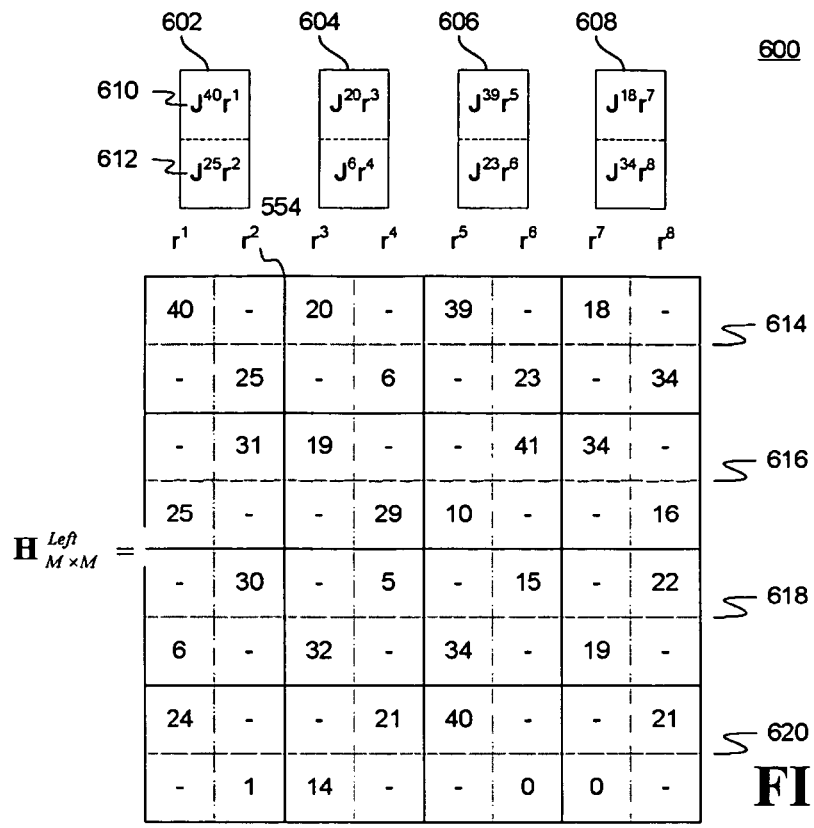
FIG. 6A illustrates a cyclic sub-block shift register representation of a left parity check matrix in accordance to one aspect of the present disclosure.
Figure 6B:
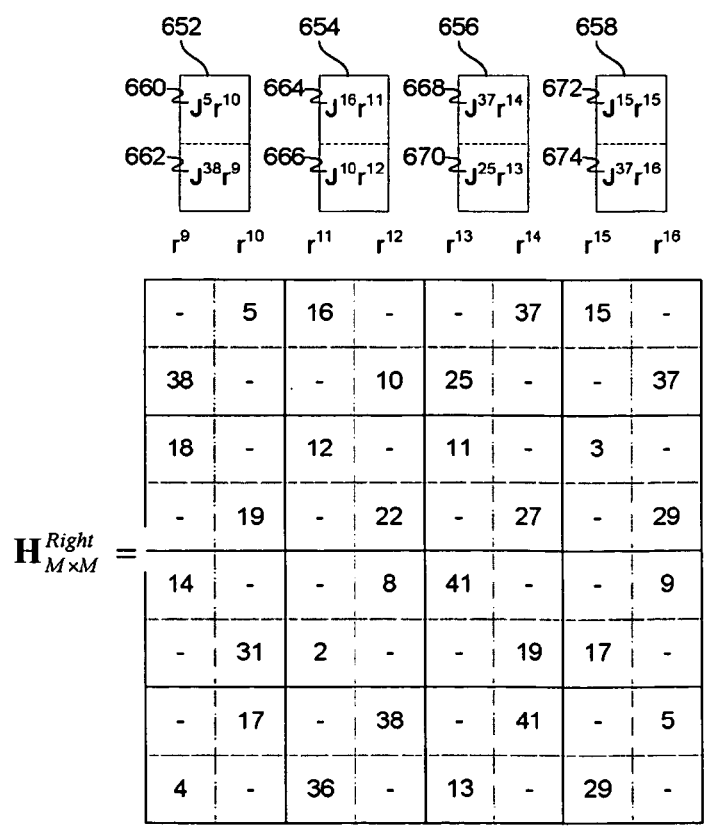
FIG. 6B illustrates a cyclic sub-block shift register representation of a right parity check matrix in accordance to one aspect of the present disclosure.

The initial values in the memory banks 702-1, 702-2, 702-3, 702-4, 704-1, 704-2, 704-3 and 704-4 correspond to the entries in the first block row in block matrix $H_{M\times M}^{Left}$ in FIG. 6A. The upper memory banks 702-1, 702-2, 702-3 and 702-4 specify the non-zero entries and their position in the first row of the first block row 614 in FIG. 6A. The lower memory banks 704-1, 704-2, 704-3, and 704-4 specify the non-zero entries and their position in the second row of the first block row 614 in FIG. 6A.

Therefore, the first step of the construction of a block matrix G, is to specify an "entry matrix" $a_{Q\times P}$ of Q×P non-zero elements chosen randomly from the set $\{0, 1, \ldots, S-1\}$. In the example of FIG. 6A, entry matrix $a_{Q\times P}$ is chosen to be $$a_{Q\times P} = \begin{bmatrix} 40 & 20 & 39 & 18 \\ 25 & 6 & 23 & 34 \end{bmatrix}$$

The second step is to place each of the columns of $a_{Q\times P}$ in the corresponding sub-block in matrix $H_{M\times M}^{Left}$ in FIG. 6A, or equivalently in the memory sub-blocks 702-1 to 702-4 in FIG. 7A. Consider for example the first column of $a_{Q\times P}$ i.e.

$$\begin{bmatrix} 40 \\ 25 \end{bmatrix}.$$

The first element, i.e. 40 is always associated with $r^1$, and the second element, i.e. 25 is always associated with $r^2$. However, there are two different ways to place the first them in memory sub-block 702-1. These are $$\begin{bmatrix} J^{40}r^1 \\ J^{25}r^2 \end{bmatrix},$$

and $$\begin{bmatrix} J^{25}r^2 \\ J^{40}r^1 \end{bmatrix}$$

In the above example Q=2. So in general, there are Qperm=Q! ways in placing the elements of a column of $a_{Q\times P}$ in the corresponding sub-block in matrix G, or equivalently in the corresponding memory sub-block. Therefore, the placements for all the rows of matrix $a_{Q\times P}$ can be fully specified by selecting a placement vector $b_{1\times P}$ with elements chosen randomly form the set {1, 2, . . . , Qperm}. In the example considered here, Q=2, there are 2 possible permutation patterns [1 2] and [2 1]. And therefore, the placement vector in FIG. 5A or equivalently in the cyclic sub-block shift register 720-1 in FIG. 7A is chosen to be $$b_{1\times P}=[1\ 1\ 1\ 1]$$

On the other hand, the placement vector in FIG. 5B or equivalently in the cyclic sub-block shift register 720-2 in FIG. 7A is chosen to be $$b_{1\times P}=[2\ 1\ 2\ 1]$$

The third step, in reference to the cyclic sub-block shift register in FIG. 7A, is the choice of fixed permuters 706-1, 706-2, 706-3, 706-4, 708-1, 708-2, 708-3 and 708-4, and the connection pattern between different memory sub-blocks, i.e. connecting memory blocks in one sub-block to memory blocks in another sub-block. The third step specifies a permuter matrix $e_{Q\times P}$ of Q×P elements chosen randomly from the set {0, 1, . . . , S−1} with the exception of the last column. The last column should be computed as will be shown shortly. The third step specifies as well as connection vector $f_{1\times P}$ of P elements chosen randomly from the set {1, 2, . . . , Qperm} with the exception of the last element. The last element should be computed as shown shortly. The permuter matrix $e_{Q\times P}$ chosen in cyclic sub-block shift register 720-1 in FIG. 7A is $$e_{Q\times P} = \begin{bmatrix} 27 & 41 & 13 & e_{1,4} \\ 6 & 23 & 18 & e_{2,4} \end{bmatrix}$$

where the entries in the last column, i.e. $e_{1,4}$ and $e_{2,4}$ are to be computed. The first connection element specifies how the memory banks 702-1 and 704-1 in the first memory sub-block 718-1 are connected to memory banks 702-2 and 704-2 in the second memory sub-block 718-2. There are two possibilities. The first possibility is to connect 702-1 to 702-2 and 704-1 to 704-2 (unlike what is shown in FIG. 7A) referred to here as connection value of 1. The second possibility is to connect 702-1 to 704-2 and 704-1 to 702-2 (as show in FIG. 7A) referred to here as connection value of 2. In the example of FIG. 7A, Q=2. In general, there are Qperm=Q! different ways of connecting one to one memory banks {1, 2, . . . , Q} in a first memory sub-block to memory banks {1, 2, . . . , Q} in a second memory sub-block. In the cyclic sub-block shift register 720-1 in the example FIG. 7A, the connection vector $f_{1\times P}$ is chosen to be $$f_{1\times P}=[2\ 1\ 2\ f_4]$$

where the last element $f_4$ is to be computed as follows.

Consider memory bank 702-1. When 702-1 travels through the vector shift register, it travels through 706-1, 704-2, 708-2, 704-3, 708-3, and 702-4. In order for 702-1 to go back to its place, 702-4 should be connected back to 702-1 and not 704-1. Therefore, in one aspect of the disclosure, the connection between the last memory sub-block back to the first memory sub-block which specifies the last element of connection vector $f_{1\times P}$ is chosen in such a way that each of the memory banks in the first memory sub-block should go back to their places after traveling through their respective paths in the cyclic sub-block shift register. In the circuit 720-1 in FIG. 7A, we obtain $f_4=1$.

Once the last element of the connection vector $f_{1\times P}$ is computed as shown above, the last vector of permuter matrix $e_{Q\times P}$ is computed as follows. Consider what happens to memory bank 702-1 when it travels through the set of fixed permuters in its path within the cyclic sub-block shift register. Memory block 702-1 with content $J^{40}r^1$ travels first through permuter 706-1, and its value change to $J^{27}\times J^{40}r^1=J^{67}r^1$. Since $J^S=I$, so in the example of FIG. 7A, $J^{42}=I$, and $J^{67}r^1$ reduces to $J^{25}r^1$. The vector $J^{25}r^1$ gets stored in 704-2 during its travel, than continues through permuter 708-2 where its value change to $J^{23}\times J^{25}r^1=J^{48}r^1=J^6r^1$, gets stored in 704-3, travels through permuter 708-3 where its value changes to $J^{18}\times J^6r^1=J^{24}r^1$, and gets stored in 702-4. In order to get back the original value $J^{40}r^1$, the last permuter 706-4 that it travels through before going back to its place 702-1, has to be $J^{16}$ since $J^{16}\times J^{24}r^1=J^{40}r^1$. Therefore, according to one aspect of the disclosure, the last permuter in each path may be computed in such a way that a memory bank traveling through the fixed permuters in a respective path within the cyclic sub-block shift register remains unchanged after it reaches again its point of departure. In other words, if we consider the set of permuters in the path of 702-1, i.e. 706-1, 708-2, 708-3, and 706-4, the multiplication of all these should be the identity matrix, i.e.

$$J^{16}\times J^{18}\times J^{23}\times J^{27}=J^{84}=J^{2\times 42}=I$$

Therefore, according to another aspect of the disclosure, the sum of the exponents of the fixed permuters along a path within a cyclic sub-block shift register representing a block matrix G, should be an integer multiple of S. If permutation matrices are used instead of cyclic shift matrices $J^n$, than according to another aspect of the disclosure, the product of the fixed permuters, $A^{(P)}\times A^{(P-1)}\times \ldots \times A^{(1)}$ where $A^{(p)}$ is the $p^{th}$ permuter matrix, along a path within a cyclic sub-block shift register representing a block matrix G, should be the identity.

The sum of the exponents in the set of permuters in the path of 704-1 is $$6+41+13+24=84=2\times 42$$

The fourth step is the construction of the remainder block rows of the block matrix. In reference to FIG. 7A, consider what happens to the cyclic sub-block shift register 720-1 during different clock cycles. After the first clock cycle, the content of 702-4, i.e. $J^{18}r^7$ goes through permuter 706-4, to become $J^{16}\times J^{18}r^7=J^{34}r^7$ and gets stored back in 702-1. The result is shown in memory block 754-1 of the updated cyclic sub-block shift register 752 in FIG. 7B. In turn, the initial content of 702-1, i.e. $J^{40}r^1$ goes through permuter 706-1, to become $J^{27} \times J^{40} r^1 = J^{25} r^1$ and gets stored back in 704-2. The result is shown in memory block 756-2 of the updated cyclic sub-block shift register 752 in FIG. 7B. After one clock cycle, the content of the initial cyclic sub-block shift register 720-1 of FIG. 7A becomes as shown in the updated cyclic sub-block shift register 752 of FIG. 7B. The content after a second clock cycle is shown in the updated cyclic sub-block shift register 764 of FIG. 7B, and the content after a third clock cycle is shown in the updated cyclic sub-block shift register 774 of FIG. 7B. Finally, if the shift register 774 of FIG. 7B is clocked again, we obtain back the initial cyclic sub-block shift register 720-1 of FIG. 7A.

The content of cyclic sub-block shift register at different clock cycles, i.e. 720-1, 752, 764, and 776 may be used to construct the block matrix $H_{M \times M}^{Left}$ in FIG. 6A. We have explained the construction of the first block row 614 from 720-1. To construct 616 from 752, first, the content of the sub-block shift register 752 is cyclically shifted to the left by one position to obtain $$\begin{bmatrix} J^{31} r^2 & J^{19} r^3 & J^{31} r^2 & J^{41} r^6 \\ J^{25} r^1 & J^{29} r^4 & J^{31} r^2 & J^{10} r^5 \end{bmatrix}$$

The second block row 616 in FIG. 6A is constructed in a similar way as block row 614 was constructed from 720-1 in FIG. 7A. Block row 618 is constructed from 764 by first cyclically shifting the content by two places to the left and then by applying the same construction procedure. Block row 620 is constructed from 774 by first cyclically shifting the content by three places to the left and then apply the same construction procedure. Matrix $H_{M \times M}^{Right}$ in FIG. 6B can be constructed in the same way from 720-2, 758, 770, and 782.

According to another aspect of the disclosure, a PCM $H_{M \times M}$ of a given rate, may be partitioned into a set of $L_R \times L_C$ block matrices $G_{(M/L_R) \times (N/L_C)}^{l_R, l_C}$ with $l_R=1:L_R$, and $l_C=1:L_C$, wherein each of the block matrices $G_{(M/L_R) \times (N/L_C)}^{l_R, l_C}$ is specified by a cyclic sub-block shift register and a set of permuters.

In the example provided above, the block matrices were block row matrices. FIGS. 8A and 8C provide an example according to one aspect of the disclosure where a block matrix is a column block matrix. In this example it is assumed that S=42. The sum of the fixed permuters 808, 810, and 812 in FIG. 8A is 3+9+30=42 which is an integer multiple of S as it should be. The corresponding block matrix G is shown in FIG. 8C. The block matrix G is composed of three column sub-blocks where each sub-block matrix comprises Q×Q element matrices where Q=3. In this example, each sub-block matrix, i.e. 852, 854, and 856, has one and only one non-zero element per element row and one and only one non-zero element per element column. According to one aspect of the disclosure, sub-blocks with at most one non-zero element per row and at most one non-zero element per element column is a preferred for a rate ½ PCM. It should be noted that a non-zero element matrix means that the corresponding entry in the examples provided is different than "–".

FIG. 8B provides another construction example of a block row according to one aspect of the disclosure. It is assumed here that S=42. In this case, the shift register is along rows and columns. The sum of the fixed permuters of connected memory banks is is 34+16+11+23=84=2×42 which is an integer multiple of S by design. The corresponding block matrix G is shown in FIG. 8D. The block matrix G is composed of four column sub-blocks where each sub-block matrix comprises (Q/2)×Q element matrices where Q=4. In this example, each sub-block matrix, i.e. 872, 874, 876, and 878, has two non-zero elements per element row and one and only one non-zero element per element column.

According to one aspect of the disclosure, some of the non-zero entries may be masked, i.e. set to zero, in order to ensure that the PCM is full rank. As an example, the PCM $$H_{M \times N}^{(1/2)} = \begin{bmatrix} H_{M \times M}^{Left} & H_{M \times M}^{Right} \end{bmatrix}$$

is not full rank. The block matrix $H_{M \times M}^{Right}$ is masked as shown in FIG. 9. The resulting matrix shown below is full rank.

$$H_{M \times N}^{(1/2)} = \begin{bmatrix} H_{M \times M}^{Left} & H_{M \times M}^{Right, masked} \end{bmatrix}$$

As an example, the original non-zero entries 574 and 576 in sub-block 552 in FIG. 5B are masked, to obtain zero entries 912 and 914 in sub-block 902 in FIG. 9.

A dataword $d_{M \times 1}$ may be encoded into a codeword $c_{N \times 1}$ such that $H_{M \times N}^{(1/2)} c_{N \times 1} = 0_{M \times 1}$. The encoding may be done in a systematic way, i.e. the codeword $c_{N \times 1}$ is partitioned into two vectors, the dataword $d_{M \times 1}$ and a parityword $p_{M \times 1}$ as follows $$c_{N \times 1} = \begin{bmatrix} d_{M \times 1} \\ p_{M \times 1} \end{bmatrix}$$

Expanding the constraint $H_{M \times N}^{(1/2)} c_{N \times 1} = 0_{M \times 1}$, we obtain $$H_{M \times M}^{Left} d_{M \times 1} = H_{M \times M}^{Right} p_{M \times 1}$$

Figure 7B:
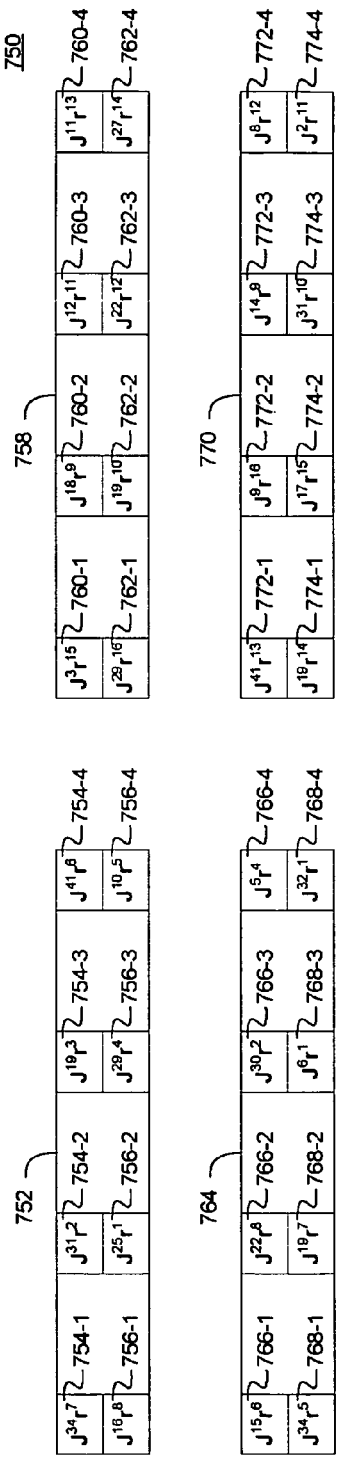
FIG. 7B illustrates the content of a cyclic sub-block shift register at different clock cycles according to one aspect of the present disclosure.
Figure 7B:
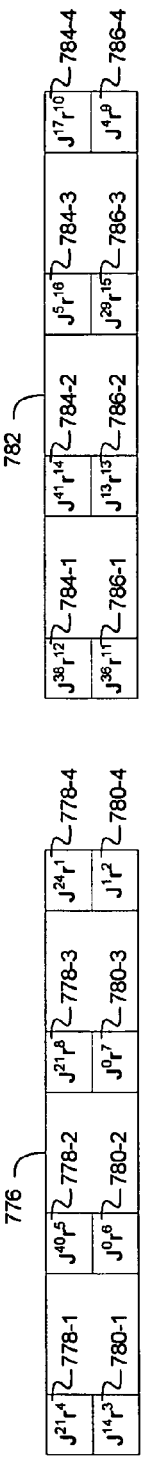

The first multiplication $u_{M \times 1} = H_{M \times M}^{Left} d_{M \times 1}$ is facilitated using the cyclic sub-block shift register structure of $H_{M \times M}^{Left}$, where the multiplication is achieved in 4 clock cycles corresponding to the four shift register updates 720-1 in FIG. 7A, and 752, 764, and 776 in FIG. 7B. The second step can be computed by inverting $H_{M \times M}^{Right}$, i.e.

$$p_{M \times 1} = (H_{M \times M}^{Right})^{-1} u_{M \times 1}$$

The inverse of $H_{M \times M}^{Right}$ can be easily computed in terms of matrix J. The above multiplication can use the same shift register using well known techniques.

According to one aspect of the disclosure, a higher coding rate PCM may be obtained from a lower coding rate PCM by combining multiple permuted rows of the lower coding rate PCM into a single row of the higher coding rate PCM. In a preferred embodiment of the disclosure, the multiple rows to be combined into a single row are chosen from the same block.

Figure 10A:
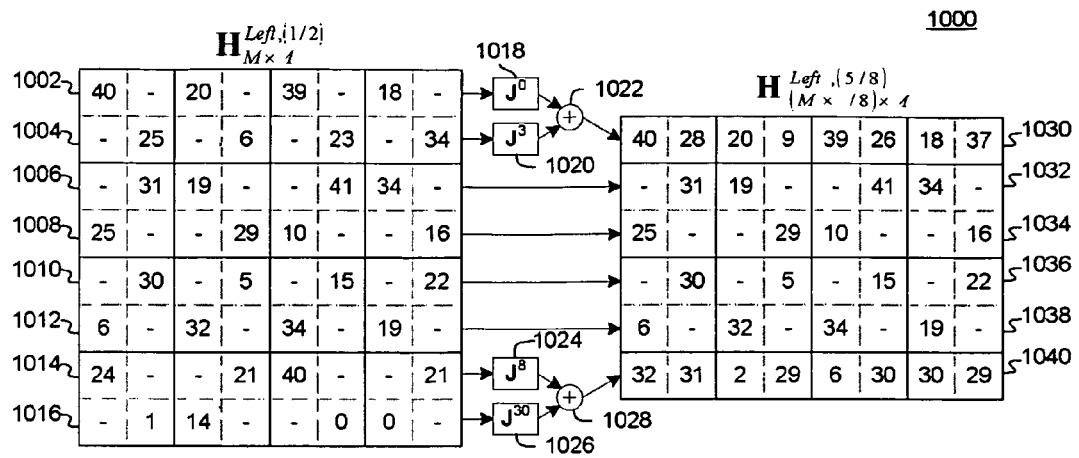
FIGS. 10A and 10B illustrate the generation of a higher coding rate LDPC matrix from a lower coding rate LDPC matrix in accordance to one aspect of the present disclosure.
Figure 10B:
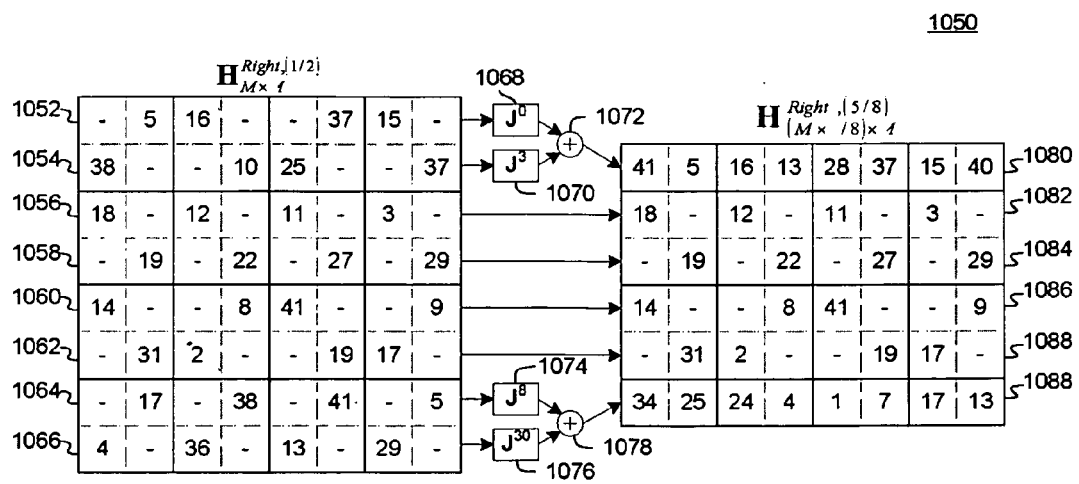

As an example, different rows of PCM $$H_{M \times N}^{(1/2)} = \begin{bmatrix} H_{M \times M}^{Left} & H_{M \times M}^{Right} \end{bmatrix}$$

of rate ½, are combined in FIGS. 10A and 10B combined in order to obtain a higher rate PCM $$H_{(M \times 5/8) \times N}^{(5/8)} = \begin{bmatrix} H_{(M \times 5/8) \times M}^{Left, (5/8)} & H_{(M \times 5/8) \times M}^{Right, (5/8)} \end{bmatrix}$$

of rate 5/8. In FIG. 8A, the first two element rows 1002 and 1004 of block matrix $H_{M \times M}^{Left,(1/2)}$ are combined into a single row 1030 ob result block matrix $H_{(M \times 5/8) \times M}^{Left,(5/8)}$. To be more specific, element row 1002 is permuted by fixed permuter 1018, and element row 1004 is permuted by fixed permuter 1020, and added together in adder 1022 to construct a row 1030 of a higher order matrix $H_{(M \times 5/8) \times M}^{Left,(5/8)}$. As shown in example in FIG. 10A, not all rows have to be combined. As an example, rows 1006, 1008, 1010, and 1012 are left unchanged. Further combining can be done using more than two rows. Element row 1014 is permuted by fixed permuter 1024, and element row 1016 is permuted by fixed permuter 1026, and added together in adder 1028 to construct a row 1040 of a higher order matrix $H_{(M \times 5/8) \times M}^{Left,(5/8)}$. The resulting matrix $H_{(M \times 5/8) \times M}^{Left,(5/8)}$ in the above example constitutes the left side of a PCM $H_{(M \times 5/8) \times N}^{(5/8)}$ of rate 5/8. The same procedure is shown in FIG. 10B to construct the right side block matrix $H_{(M \times 5/8) \times M}^{Left,(5/8)}$.

In another aspect of the present disclosure, a higher coding rate PCM may be obtained from one or multiple high rate block matrices, wherein each high rate block matrix is obtained by combining multiple permuted rows of the lower coding rate block matrix of a low rate PCM into a single row of the higher coding rate PCM. Furthermore, the rows of the high rate block matrices may be shuffled, cyclic shifted by a multiple of sub-blocks and masked.

Figure 13:
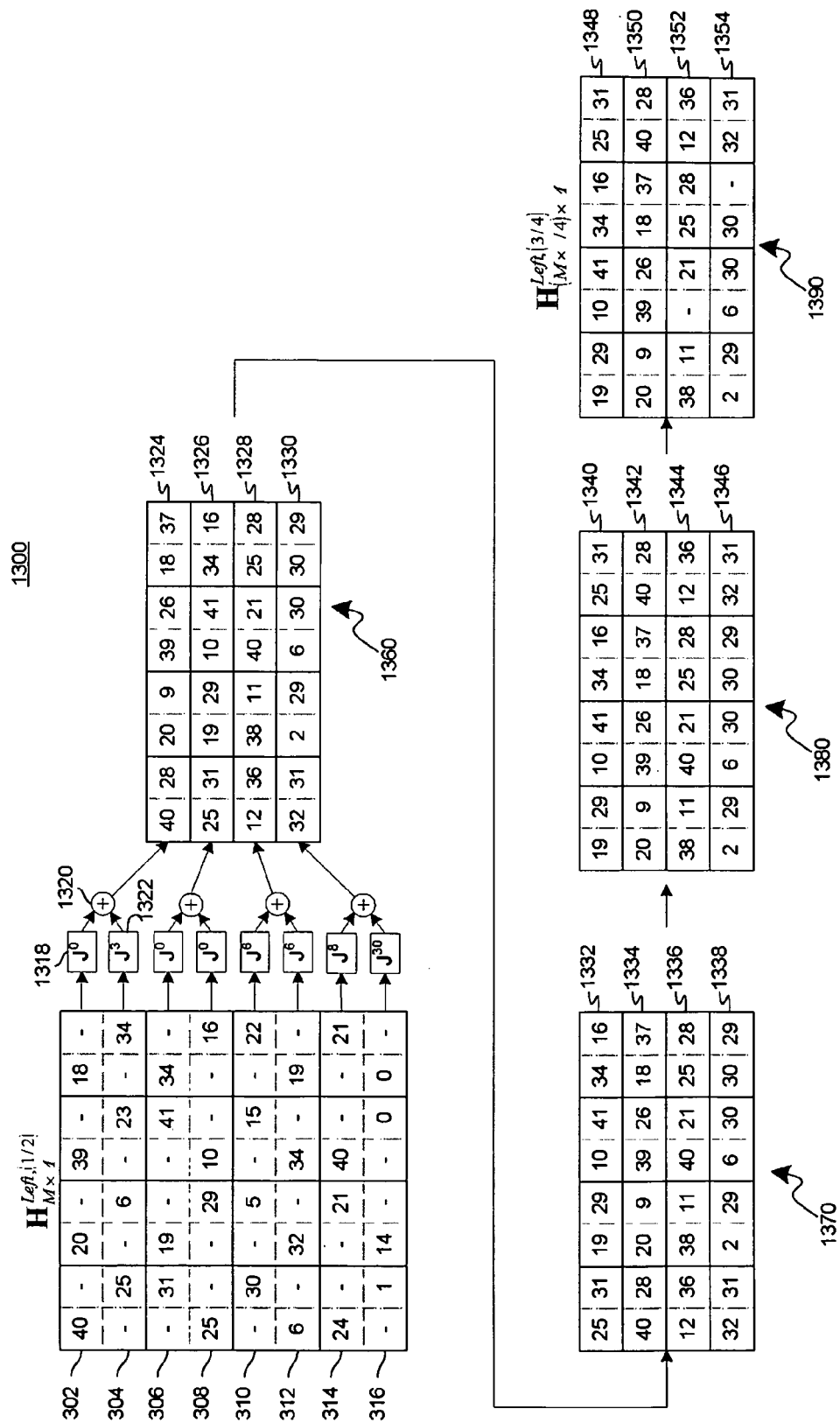
FIG. 13 illustrates the generation of a higher coding rate LDPC matrix from a lower coding rate LDPC matrix in accordance to one aspect of the present disclosure.

FIG. 13 illustrates the above embodiment. As shown in the example in FIG. 13, elements rows 1302 to 1316 of block matrix $H_{M \times M}^{Left(1/2)}$ may be permuted and combined into sub-block rows 1324, 1326, 1328 and 1340 of high rate block matrix 1360. As an example, element rows 1302 and 1304 are first permuted using permuters 1318 and 1322 are added using adder 1320 to produce sub-block row 1324 of higher rate block matrix 1340. The sub-block rows of the higher rate matrix 1340 may be further shuffled. As an example, sub-block rows 1324 and 1326 are exchanged to obtain higher order block matrix 1370. Further, the sub-block rows of block matrix 1370 may be cyclic shifted to the left or to the right by any multiple of the sub-block matrix size Q. For the example in FIG. 13, Q=2, and as an example high rate matrix 1380 is obtained by cyclic shifting high rate matrix 1370 by 2 positions to the left. Some entries may be masked as shown in 1390 where the left high rate block matrix $H_{(M \times 3/4) \times M}^{Left,(3/4)}$ is obtained. Finally, some rows or columns might be deleted (not shown in FIG. 13). The formation of the high rate block matrix $H_{(M \times 3/4) \times M}^{right,(3/4)}$ may be obtained using similar steps. However, the right block matrix may use different combining, different permutations, different shuffling and different masking, i.e. it may be formed in a completely independent manner to that of $H_{(M \times 3/4) \times M}^{Left,(3/4)}$. Finally, the rate 3/4 PCM, $$H_{(M \times 3/4) \times M}^{(3/4)} = [H_{(M \times 3/4) \times M}^{Left,(3/4)} \quad H_{(M \times 3/4) \times M}^{right,(3/4)}]$$

is obtained from the constituent block matrices. Therefore, it should be obvious that a multitude of coding rates may be obtained by forming different higher rate blocks matrices form a lower rate block matrices using combining, permutations, shuffling, sub-block cyclic shifting, masking and deleting rows.

As another example, if we delete the last row of PCM $H_{(M \times 3/4) \times M}^{(3/4)}$ constructed above, we obtain a PCM with 3 rows and 16 columns. The resulting PCM has a coding rate of 13/16. It can be easily shown that all rates Z/16 can be generated from the original matrix with Z=8, 9, . . . , 15.

Figure 11:
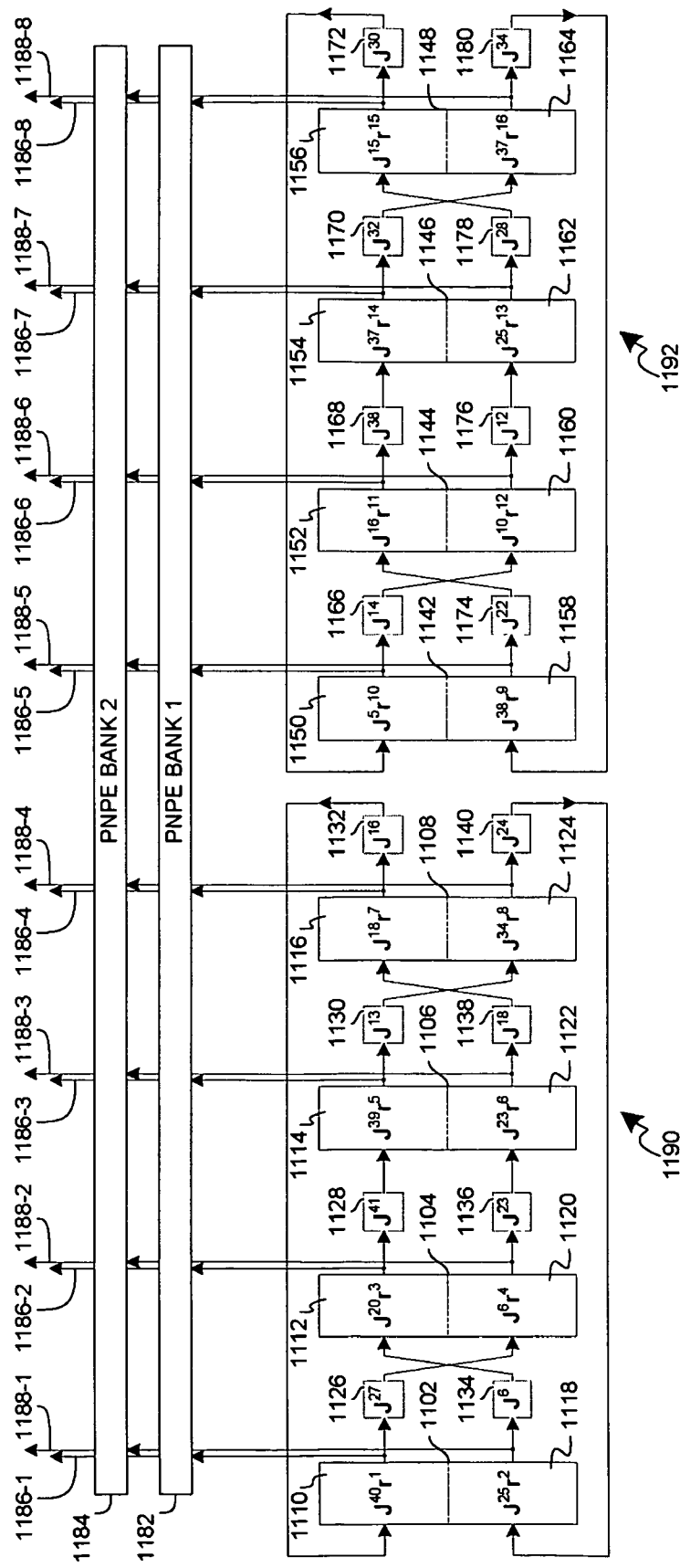
FIG. 11 illustrates an example variable node processing elements of an LDPC decoder in accordance with certain aspects of the present disclosure.

According to one aspect of the disclosure, the variable nodes in VNPEs in the decoder may be stored in cyclic sub-blocks shift register wherein the cyclic sub-block shift register comprise fixed permuters connecting different memory banks to each other. An example decoder for rate 1/2 for the constructed PCM in the above example, $$H_{M \times N}^{(1/2)} = [H_{M \times M}^{Left} \quad H_{M \times M}^{Right}],$$

is shown in FIG. 11. As explained above, the left cyclic block shift register is uploaded with rotated element vectors $r^{(l)}$ with l=1:8 in accordance to the first sub-block row of matrix $H_{M \times M}^{Left}$ in FIG. 6A, and the right cyclic block shift register is uploaded with rotated element vectors $r^{(l)}$ with l=9:16 in accordance to the first sub-block row of matrix $H_{M \times M}^{Right}$ in FIG. 6B. The outputs of the upper memory banks of 1190, i.e. memory banks 1110, 1112, 1114, and 1116 are connected to a first bank of S PNPEs 1182. Similarly, the outputs of the upper memory banks of 1192, i.e. memory banks 1150, 1152, 1154, and 1156 are connected to the same first bank 1182 of S PNPEs. Therefore each of the S PNPEs in 1182 has 8 inputs and produces 8 parity messages such as those shown in 1186-1 to 1186-8.

The outputs of the lower memory banks of 1190, i.e. memory banks 1118, 1120, 1122, and 1124 are connected to a second bank of S PNPEs. Similarly, the outputs of the lower memory banks of 1192, i.e. memory banks 1158, 1160, 1162, and 1164 are connected to the same second bank of S PNPEs. Each of the S PNPEs in the second bank 1184 has 8 inputs and produces 8 parity messages such as those shown in 1188-1 to 1188-8.

When an entry in the PCM is masked, the masked entry may be replaced by a high positive number when inputted to a PNPE in order not to affect the functionality of the PNPE. As an example, using the min-sum algorithm, a PNPE computes the signs, the first minimum and second minimum from which the parity messages are computed. If an entry is masked and substituted with a high positive number, the overall parity (sign) remains unaffected as well as the first minimum and second minimum and therefore the parity messages.

The produced parity messages 1186-1 to 1186-8 and 1188-1 to 1188-8 may be pipelined and are fed back through a set of fixed permuters to be added (not shown) to the content of the memory banks within the cyclic sub-blocks shift register 1190 and 1192. This is best illustrated in FIG. 12.

Figure 12:
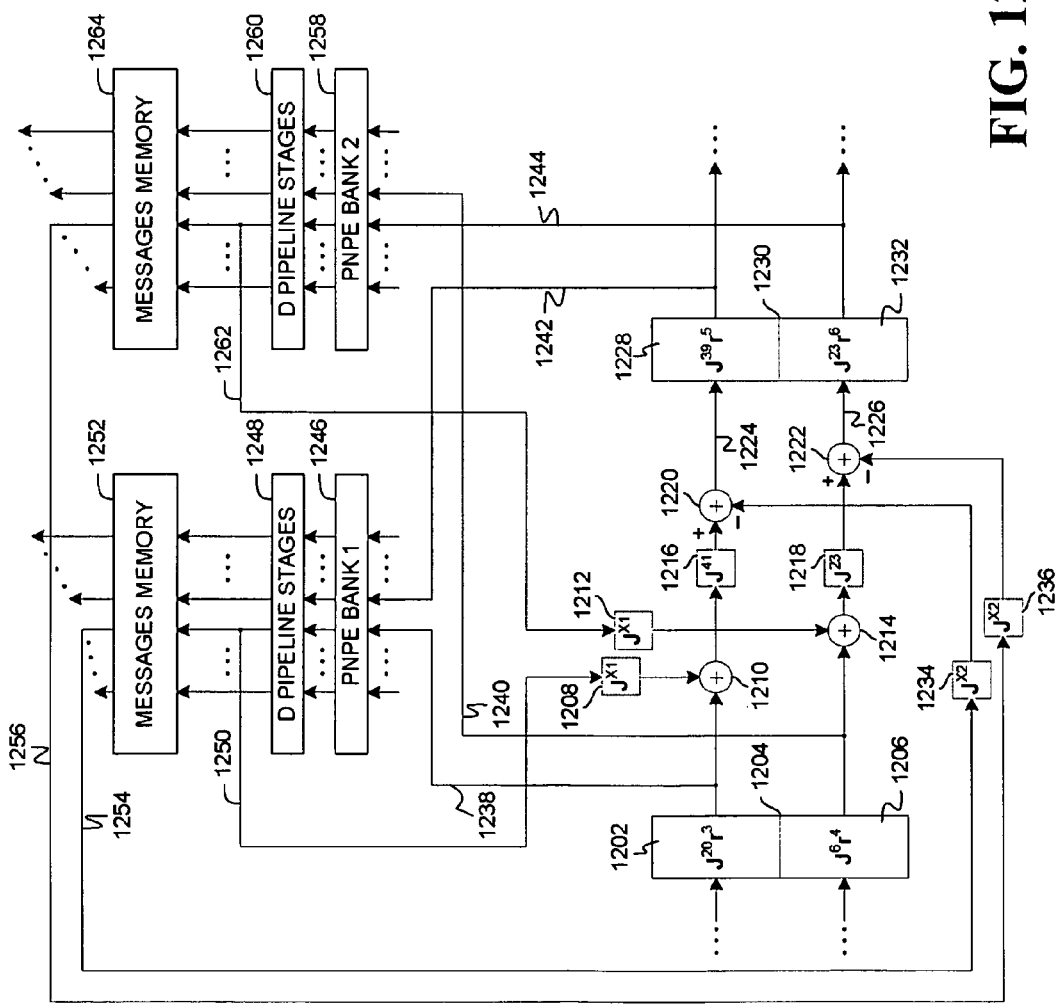
FIG. 12 illustrates an example LDPC decoder in accordance with certain aspects of the present disclosure.

FIG. 12 illustrates the high speed LDPC decoder according to one aspect of the disclosure. Only the memory sub-blocks 1112 and 1114 in FIG. 11 are shown in FIG. 12 in order to illustrate the decoder functionality. The outputs (output vectors) 1238 and 1242 of the upper memory banks 1202 and 1228 are input to PNPE bank number 1, and the outputs 1240 and 1244 from the lower memory banks 1206 and 132 are input to PNPE bank number 2. Each PNPE bank takes eight input vector in reference to FIG. 11, and only shown two of these vectors corresponding to memory sub-blocks 1204 and 1230. Each PNPE bank produces eight output vectors, i.e. parity message vectors. Therefore, PNPE bank 1 in 1246 produces eight output vectors in the current example and PNPE bank 2 in 1258 produce eight output vectors. The PNPE banks might be pipelined as shown in blocks 1248 and 1260. This might be especially required for high coding rates obtained for lower coding rates since in this case multiple PNPE banks of lower rates are combined to form a PNPE bank of a higher rate. The outputs of the pipelined PNPE banks are fed back are being permuted with fixed permuters to be added to the corresponding outputs of the memory banks. As an example, output vector 1250 is permuted using a fixed permuter $J^{X1}$ 1208 before being added using adder 1210 to the output of memory bank 1202. The fixed permuter is required here to compensate for the pipeline delay in 1248. The output of adder 1210 is permuted using fixed permuter 1216 which corresponds to permuter 1128 in FIG. 1. The parity messages at the output of the pipeline stages 1248 and 1260 are stored in memory banks 1252 and 1264 which might be implemented as shift registers. The output of the adder 1210 is input to subtractor 1220 which subtracts the old parity check messages from the accumulated parity messages and rotated received vector. The subtractor computes the difference between the permuted accumulator output, i.e. output of 1216 and the permuted old message, i.e. message 1254 permuted with permuter 1234. The output 1224 of subtractor 1220 is fed back to memory bank 1228 of memory sub-block 1232. Permuters 1234 and 1236 are required to compensate for the overall delay due to pipelining in 1248 and parity messages storage in 1252.

At each clock cycle, sub-block row comprising two element rows of the example PCM $H_{M \times N}^{(1/2)}$ are processed, and that is the reason why there are two PNPE banks in FIGS. 11 and 12. At the first clock cycle, the first sub-block row of $H_{M \times N}^{(1/2)}$, at the second clock cycle, the content of the cyclic-sub-block shift registers correspond to the second sub-block row of $H_{M \times N}^{(1/2)}$ and gets processed and so on. So for the example PCM $H_{M \times N}^{(1/2)}$, four clock cycles are required to process the entire matrix, and therefore one iteration corresponds to four clock cycles. Multiple iterations are used until a stopping criterion is met as discussed above. The above architecture may be easily modified to process one element row per clock cycle, i.e. one PNPE bank only, which means that one iteration requires eight clock cycles. The above architecture may as well be easily modified to process multiple sub-blocks per iteration. As an example two sub-blocks may be processed per clock cycle and require four PNPE banks, and one iteration requires two clock cycles. Finally, the decoder may also be serialized, which means that one or multiple PNPEs may be used, i.e. fraction of a bank, and in this case one iteration is achieved in a number of cycles bigger than four.

The decoder in FIG. 12 has a simple memory structure, avoids unnecessary multiplexing, and completely solves the interconnect problem found in standard LDPC decoders. The hard decision, i.e. estimate of the original message; may be taken at any moment form the adders at the outputs of the memory banks, i.e. adders such as 1210, 1214 and so on. A hard decision on these outputs is first performed and rotations using a fixed set of permuters might be required.

Therefore, as shown above, according to one aspect of the disclosure, an LDPC decoder using cyclic sub-blocks of shift register is used with a set of fixed permuters to update the variable and parity nodes and provide an estimate of the data.

The example decoder in FIG. 12 may be used to decode multiple rates by adding another layer of PNPEs banks that might take as inputs the outputs of PNPEs bank designed for lower rates such as rate ½. For example, if a first and a second PNPE for rate ½ uses the min-sum algorithm and therefore each computes a minimum over a set of 8 inputs, than a third PNPE added to provide higher coding rates, may compare a first minimum form the first PNPE and a second minimum form the second PNPE to provide an overall minimum over 16 outputs. In reality, the min-sum algorithm requires the computation of first minimum and a second minimum over the remaining set of inputs excluding the first minimum. This can be easily accommodated in the above description.

Figure 14A:
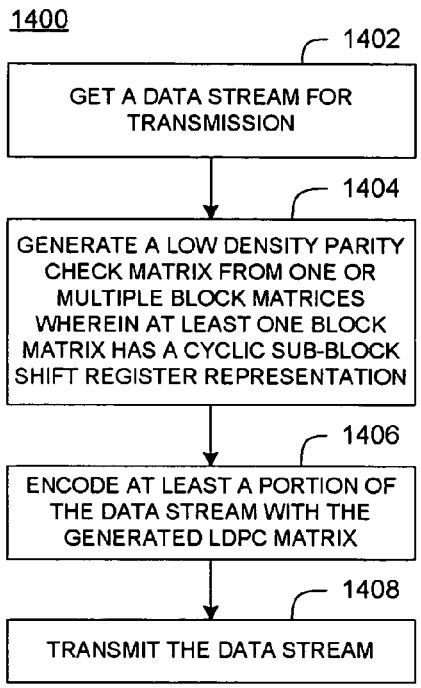
FIG. 14A illustrates example operations for LDPC encoding in accordance with certain aspects of the present disclosure.

FIG. 14A illustrates example operations 1400 that summarize the LDPC encoding applied at a transmission side of the wireless communication system. At 1402, an original transmission data stream may be obtained. At 1404 an LDPC matrix is obtained wherein the LDPC matrix may be generated from one or multiple block matrices and wherein at least one of the block matrices has a cyclic sub-block shift register representation with a set of fixed permuters. The, at 1406, at least a portion of the data stream is encoded using the generated LDPC matrix. At 1406, the modulated data stream may be transmitted.

Figure 14B:
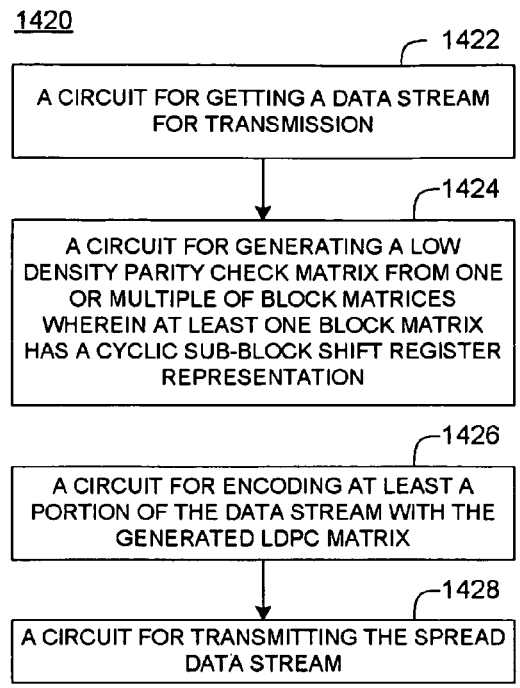
FIG. 14B illustrates example components capable of performing the operations illustrated in FIG. 14A.
Figure 14C:
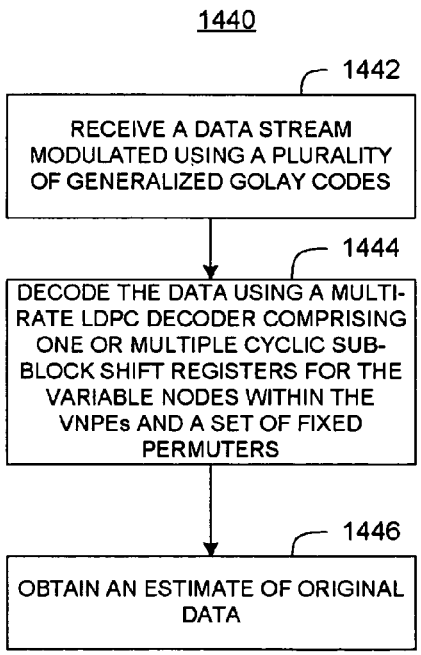
FIG. 14C illustrates an example operations for processing of LDPC encoded signal at the receiver in accordance with certain aspects of the present disclosure.

FIG. 14C illustrates example operations 1440 that may be performed to process received modulated signals. The receiving method provides for processing signals transmitted by a transmit-side signal processor (such as the receiver 304 in FIG. 3) after the signals have propagated through a multipath channel. Receiver front-end processing provides for down-converting and digitizing received signals in order to produce digital baseband signals.

At 1444, the baseband modulated data stream is demodulated using a multi-rate LDPC decoder comprising at least one cyclic sub-block shift registers for the variable nodes and a set of fixed permuters as the one illustrated in FIG. 11. At 1446, the original data is estimated using the output of the generalized Golay decoder.

Figure 14D:
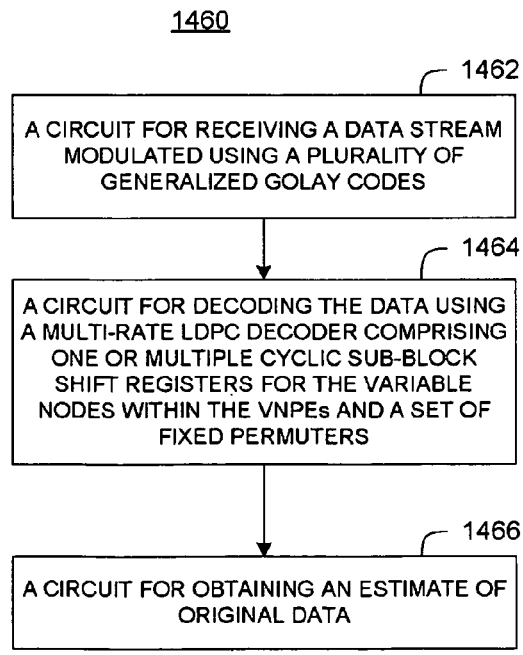
FIG. 14D illustrates example components capable of performing the operations illustrated in FIG. 14C.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in Figures, those operations may have corresponding counterpart means-plus-function components with similar numbering. For example, blocks 1402-1408, and 1442-1446, illustrated in FIGS. 14A, 14B and 14C correspond to circuit blocks 1422-1428, and 1462-1466 illustrated in FIGS. 14B and 14D.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The techniques provided herein may be utilized in a variety of applications. For certain aspects, the techniques presented herein may be incorporated in a base station, a mobile handset, a personal digital assistant (PDA) or other type of wireless device that operate in UWB part of spectrum with processing logic and elements to perform the techniques provided herein.

The invention claimed is:

1. A method for communication, comprising:
generating at least one block matrix having a cyclic sub-block shift registers representation comprising a set of memory components coupled to a set of fixed permuters;
combining rows of the at least one block matrix into sub-block rows of at least one high-rate block matrix; and
generating at least one low density parity check matrix from the at least one high-rate block matrix.

2. The method of claim 1, wherein generating the at least one block matrix further comprises permuting rows of the at least one block matrix.

3. The method of claim 1, further comprising encoding at least a portion of a data stream with the low density parity check matrix.

4. The method of claim 3, wherein encoding comprises employing at least one cyclic sub-block shift register.

5. The method of claim 1, further comprising shuffling the sub-block rows before generating the at least one low density parity check matrix.

6. The method of claim 1, further comprising cyclic shifting the sub-block rows before generating the at least one low density parity check matrix.

7. The method of claim 1, further comprising masking entries of the sub-block rows before generating the at least one low density parity check matrix.

8. The method of claim 1, further comprising deleting one or more of the sub-block rows before generating the at least one low density parity check matrix.

9. The method of claim 1, wherein the at least one block matrix comprises element matrices, the element matrices being selected from a set of cyclic shifted identity matrices and a zero matrix.

10. The method of claim 1, wherein the at least one block matrix comprises element matrices, the element matrices being selected from a set of permutation matrices and a zero matrix.

11. An apparatus for communication, comprising:
a block matrix generator for generating a block matrix;
a set of adders for adding rows of the block matrix to produce sub-block rows of at least one higher-rate block matrix; and
a low density parity check matrix generator for generating at least one low density parity check matrix from the at least one higher-rate block matrix.

12. The apparatus of claim 11, further comprising a set of permuters for permuting rows of the at least one block matrix.

13. The apparatus of claim 11, further comprising an encoder for encoding at least a portion of a data stream with the low density parity check matrix.

14. The apparatus of claim 13, wherein the encoder comprises employing at least one cyclic sub-block shift register.

15. The apparatus of claim 11, further comprising a shuffler for shuffling the sub-block rows.

16. The apparatus of claim 11, further comprising a cyclic shifter for cyclic shifting the sub-block rows.

17. The apparatus of claim 11, further comprising a mask for masking entries of the sub-block rows.

18. The apparatus of claim 11, further comprising a matrix processor for deleting one or more of the sub-block rows.

19. A non-transitory machine-readable medium comprising instructions encoded thereon and executable to:
- generate at least one block matrix having a cyclic sub-block shift registers representation;
- combine rows of the at least one block matrix into sub-block rows of at least one high-rate block matrix; and
- generate at least one low density parity check matrix from the at least one high-rate block matrix.

20. The machine-readable medium of claim 19, further comprising instructions encoded thereon and executable to permute the rows of the at least one block matrix.

21. The machine-readable medium of claim 19, further comprising instructions encoded thereon and executable to encode at least a portion of a data stream with the low density parity check matrix.

22. The machine-readable medium of claim 19, further comprising instructions encoded thereon and executable to shuffle the sub-block rows.

23. The machine-readable medium of claim 19, further comprising instructions encoded thereon and executable to cyclic shift the sub-block rows.

24. The machine-readable medium of claim 19, further comprising instructions encoded thereon and executable to mask entries of the sub-block rows.

25. The machine-readable medium of claim 19, further comprising instructions encoded thereon and executable to delete one or more of the sub-block rows.

26. The machine-readable medium of claim 19, wherein the at least one block matrix comprises element matrices, the element matrices being selected from a set of cyclic shifted identity matrices and a zero matrix.

27. The machine-readable medium of claim 19, wherein the at least one block matrix comprises element matrices, the element matrices being selected from a set of permutation matrices and a zero matrix.

* * * * *